United States Patent
Watabe et al.

(10) Patent No.: US 12,364,115 B2
(45) Date of Patent: Jul. 15, 2025

(54) LIGHT-EMITTING DEVICE, LIGHT-EMITTING APPARATUS, ELECTRONIC DEVICE, AND LIGHTING DEVICE

(71) Applicant: Semiconductor Energy Laboratory Co., Ltd., Kanagawa-ken (JP)

(72) Inventors: Takeyoshi Watabe, Kanagawa (JP); Airi Ueda, Kanagawa (JP); Nobuharu Ohsawa, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 555 days.

(21) Appl. No.: 17/780,247

(22) PCT Filed: Nov. 18, 2020

(86) PCT No.: PCT/IB2020/060831
§ 371 (c)(1),
(2) Date: May 26, 2022

(87) PCT Pub. No.: WO2021/111227
PCT Pub. Date: Jun. 10, 2021

(65) Prior Publication Data
US 2023/0037397 A1  Feb. 9, 2023

(30) Foreign Application Priority Data
Dec. 2, 2019 (JP) .................................. 2019-217749

(51) Int. Cl.
*H01L 51/52* (2006.01)
*H10K 50/858* (2023.01)
(Continued)

(52) U.S. Cl.
CPC ......... *H10K 59/126* (2023.02); *H10K 50/858* (2023.02); *H10K 50/81* (2023.02); *H10K 50/828* (2023.02); *H10K 59/65* (2023.02)

(58) Field of Classification Search
CPC ...... H10K 50/81; H10K 50/828; H10K 59/65; H10K 50/11; H10K 59/32; H10K 59/40;
(Continued)

(56) References Cited

U.S. PATENT DOCUMENTS 9,960,371 B2  5/2018  Yamaguchi et al.
9,978,960 B2  5/2018  Inoue et al.
(Continued)

FOREIGN PATENT DOCUMENTS

CN  107148673 A  9/2017
JP  63-018302 A  1/1988
(Continued)

OTHER PUBLICATIONS

International Search Report (Application No. PCT/IB2020/060831) Dated Mar. 2, 2021.
(Continued)

*Primary Examiner* — Elmito Breval
(74) *Attorney, Agent, or Firm* — Husch Blackwell LLP

(57) ABSTRACT

A near-infrared organic EL device with favorable efficiency is provided. A light-emitting device including a first electrode, a second electrode, and an EL layer is provided; in which the EL layer is positioned between the first electrode and the second electrode; in which the EL layer emits light having a peak of an emission spectrum in a wavelength range of greater than or equal to 750 nm and less than or equal to 1000 nm; in which one of the first electrode and the second electrode is an electrode having a transmitting property with respect to light with a peak wavelength of the emission spectrum of the EL layer; in which a first layer is (Continued)

provided in contact with a surface of the electrode having a transmitting property, which is opposite to a surface facing the EL layer; in which the first layer contains an organic compound; and in which the first layer has the local maximum value of an extinction coefficient k in the visible light region.

19 Claims, 19 Drawing Sheets

(51) Int. Cl.
  *H10K 59/126* (2023.01)
  *H10K 50/81* (2023.01)
  *H10K 50/828* (2023.01)
  *H10K 59/65* (2023.01)

(58) Field of Classification Search
  CPC .............. H10K 85/342; A47L 2201/00; A47L 2201/04; A47L 9/2805; A47L 9/2826; A47L 9/30; A47L 11/4011; A47L 11/4061; A47L 9/2857; H05B 33/02; H05B 33/26; H05B 33/28; H05B 33/06
  See application file for complete search history.

(56) References Cited

U.S. PATENT DOCUMENTS

| | | |
|---|---|---|
| 10,228,328 B2 | 3/2019 | Adachi et al. |
| 10,283,722 B2 | 5/2019 | Yamaguchi et al. |
| 2017/0352695 A1 | 12/2017 | Tsuchiya |
| 2018/0149595 A1 | 5/2018 | Adachi et al. |
| 2021/0320267 A1 | 10/2021 | Seo et al. |
| 2021/0351224 A1 | 11/2021 | Yamazaki et al. |
| 2022/0029134 A1 | 1/2022 | Watabe et al. |
| 2022/0069258 A1 | 3/2022 | Watabe et al. |

FOREIGN PATENT DOCUMENTS

| | | |
|---|---|---|
| JP | 2007-165165 A | 6/2007 |
| JP | 2016-115862 A | 6/2016 |
| JP | 2017-114853 A | 6/2017 |
| JP | 2018-092993 A | 6/2018 |
| JP | 2018-125434 A | 8/2018 |
| JP | 2019-032351 A | 2/2019 |
| JP | 2019-114780 A | 7/2019 |
| WO | WO 2016/098283 A1 | 6/2016 |
| WO | WO 2017/110939 A1 | 6/2017 |

OTHER PUBLICATIONS

Written Opinion (Application No. PCT/IB2020/060831) Dated Mar. 2, 2021.

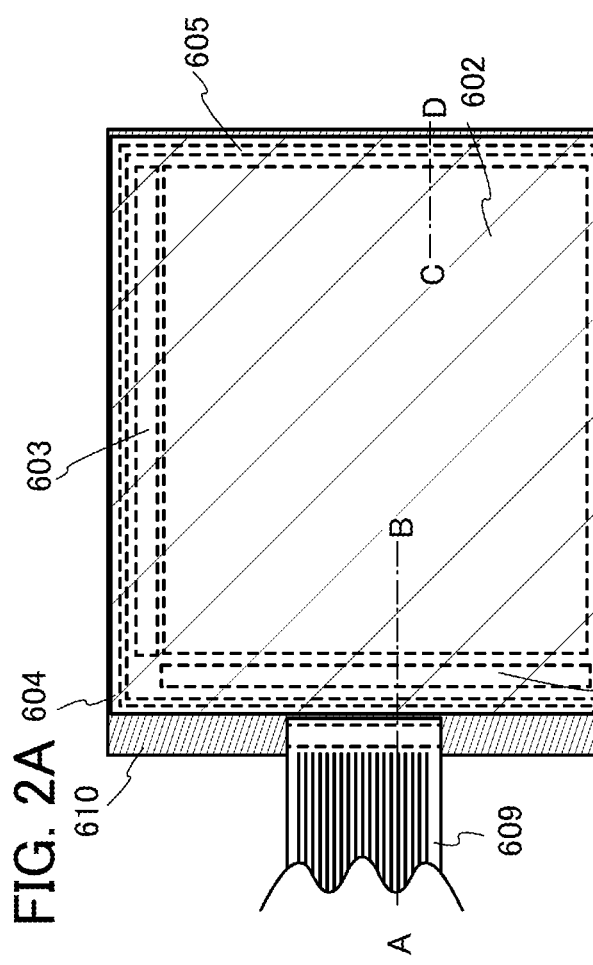
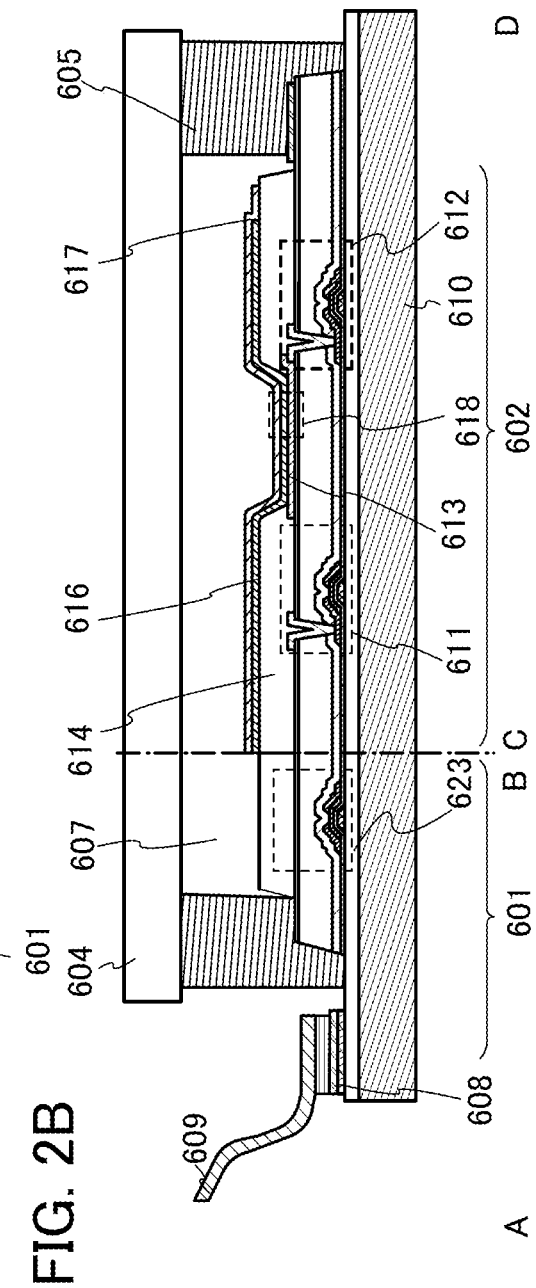
FIG. 2A
FIG. 2B

LIGHT-EMITTING DEVICE, LIGHT-EMITTING APPARATUS, ELECTRONIC DEVICE, AND LIGHTING DEVICE

This application is a 371 of international application PCT/IB2020/060831 filed on Nov. 18, 2020 which is incorporated herein by reference.

TECHNICAL FIELD

One embodiment of the present invention relates to an organic compound, a light-emitting element, a light-emitting device, a display module, a lighting module, a display apparatus, a light-emitting apparatus, an electronic device, a lighting device, and an electronic appliance. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display apparatus, a liquid crystal display apparatus, a light-emitting apparatus, a lighting device, a power storage device, a memory device, an imaging device, a driving method thereof, and a manufacturing method thereof.

BACKGROUND ART

Light-emitting devices (organic EL devices) including organic compounds and utilizing electroluminescence (EL) have been put into practical use. In the basic structure of such light-emitting devices, an organic compound layer containing a light-emitting material (an EL layer) is interposed between a pair of electrodes. Carriers are injected by application of voltage to the element, and recombination energy of the carriers is used, whereby light emission can be obtained from the light-emitting material.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps; thus, the light-emitting devices also have great potential as planar light sources, which can be applied to lighting and the like.

When the organic EL devices are fabricated over flexible substrates such as plastic substrates, flexible light sources can be achieved.

Meanwhile, in recent years, research has been extensively conducted on organic EL devices emitting light in a near-infrared region with a long wavelength (780 nm to 1400 nm). Since transmittance for water or hemoglobin is high in the wavelength range, the devices can be used for sensing on a living body (biosensing). As described above, the organic EL devices have characteristics such as flexibility and capability of being used as a planar light source and easily fit to the shape of a living body, and thus it is said that the organic EL devices emitting near-infrared light are suitably applied to biosensing.

Accordingly, the organic EL devices emitting near-infrared light are valuable technique, but there is a problem in that the emission efficiency is essentially lower than that of other emission colors. This is because of the effect of the band gap laws. In addition, in the case where a host is doped with a near-infrared light-emitting dopant in a light-emitting layer, the HOMO-LUMO gap of the dopant is extremely narrower than that of the host, and thus a carrier trap is easily formed, which is one of the reasons. This not only reduces the emission efficiency but also adversely affect the element lifetime in some cases. For these reasons, there are very few research reports on organic EL devices with high emission efficiency and long lifetime that emit near-infrared light.

Patent Document 1 reports a phosphorescent dopant having the emission spectrum from deep red to the near infrared.

REFERENCE

Patent Document

[Patent Document 1] Japanese Published Patent Application No. 2017-114853

SUMMARY OF THE INVENTION

Problems to be Solved by the Invention

Another object of one embodiment of the present invention is to provide a near-infrared light-emitting device with high emission efficiency. Another object of one embodiment of the present invention is to provide a light-emitting device, a light-emitting apparatus, an electronic device, a display apparatus, and an electronic appliance each with low power consumption.

Note that the description of these objects does not preclude the existence of other objects. In one embodiment of the present invention, there is no need to achieve all of these objects. Other objects will be apparent from the descriptions of the specification, the drawings, the claims, and the like, and other objects can be derived from the descriptions of the specification, the drawings, the claims, and the like.

It is only necessary that at least one of the above-described objects be achieved in the present invention.

Means for Solving the Problems

One embodiment of the present invention is a light-emitting device including a first electrode, a second electrode, and an EL layer; in which the EL layer is positioned between the first electrode and the second electrode; in which the EL layer emits light having a peak of an emission spectrum in a wavelength range of greater than or equal to 750 nm and less than or equal to 1000 nm; in which one of the first electrode and the second electrode is an electrode having a transmitting property with respect to light with a peak wavelength of the emission spectrum of the EL layer; in which the electrode having a transmitting property is provided with a first layer in contact with a surface of the electrode having a transmitting property, which is opposite to a surface where the EL layer is formed; in which the first layer contains an organic compound; and in which the first layer has the local maximum value of an extinction coefficient k in a visible light region.

Another embodiment of the present invention is a light-emitting device including a first electrode, a second electrode, and an EL layer; in which the EL layer is positioned between the first electrode and the second electrode; in which the EL layer emits light having a peak of an emission spectrum in a wavelength range of greater than or equal to 750 nm and less than or equal to 1000 nm; in which one of the first electrode and the second electrode is an electrode having a transmitting property with respect to light with a peak wavelength of the emission spectrum of the EL layer; in which the electrode having a transmitting property is provided with a first layer in contact with a surface of the electrode having a transmitting property, which is opposite to a surface where the EL layer is formed; in which the first layer contains an organic compound; and in which the maximum value of an extinction coefficient k in a visible light region of the first layer is greater than or equal to 0.05.

Another embodiment of the present invention is a light-emitting device including a first electrode, a second electrode, and an EL layer; in which the EL layer is positioned between the first electrode and the second electrode; in which the EL layer emits light having a peak of an emission spectrum in a wavelength range of greater than or equal to 750 nm and less than or equal to 1000 nm; in which one of the first electrode and the second electrode is an electrode having a transmitting property with respect to light with a peak wavelength of the emission spectrum of the EL layer; in which the electrode having a transmitting property is provided with a first layer in contact with a surface of the electrode having a transmitting property, which is opposite to a surface where the EL layer is formed; in which the first layer contains an organic compound; and in which the maximum value of an extinction coefficient k in a visible light region of the first layer is greater than or equal to 0.2.

Another embodiment of the present invention is a light-emitting device with the above structure in which a refractive index n of the first layer is greater than or equal to 1.9 in the peak wavelength of the emission spectrum of the EL layer.

Another embodiment of the present invention is a light-emitting device with the above structure in which one of the first electrode and the second electrode is an electrode having a transmitting property with respect to light with the peak wavelength of the emission spectrum of the EL layer, and the other is an electrode having a reflective property with respect to light with the peak wavelength of the emission spectrum of the EL layer.

Another embodiment of the present invention is a light-emitting device with the above structure in which the electrode having a transmitting property is a transflective electrode further having a reflective property with respect to light with the peak wavelength of the emission spectrum of the EL layer.

Another embodiment of the present invention is a light-emitting device with the above structure in which the second electrode is the electrode having a transmitting property and the second electrode is a cathode.

Another embodiment of the present invention is a light-emitting device with the above structure in which the first electrode is the electrode having a transmitting property and the first electrode is an anode.

Another embodiment of the present invention is a light-emitting device with the above structure in which one kind of an organic compound is contained in the first layer.

Another embodiment of the present invention is a light-emitting device with the above structure in which the organic compound contained in the first layer is a substance that can be evaporated by resistance heating.

Another embodiment of the present invention is an electronic device including the above light-emitting device, a sensor, an operation button, a speaker, or a microphone.

Another embodiment of the present invention is a light-emitting apparatus including the above light-emitting device, and a transistor or a substrate.

Another embodiment of the present invention is a lighting device including the above light-emitting device and a housing.

Note that the light-emitting apparatus in this specification includes, in its category, an image display device that uses a light-emitting device. In some cases, the light-emitting (display) apparatus also includes a module in which a light-emitting device is provided with a connector such as an anisotropic conductive film or a TCP (Tape Carrier Package), a module in which a printed wiring board is provided at the end of a TCP, and a module in which an IC (integrated circuit) is directly mounted on a light-emitting device by a COG (Chip On Glass) method. Furthermore, in some cases, lighting equipment or the like includes the light-emitting apparatus.

Effect of the Invention

Another embodiment of the present invention can provide a near-infrared light-emitting device with high emission efficiency. One embodiment of the present invention can provide a light-emitting device, a light-emitting apparatus, an electronic device, a display apparatus, and an electronic appliance each with low power consumption.

Note that the description of these effects does not preclude the existence of other effects. One embodiment of the present invention does not have to have all of these effects. Other effects will be apparent from the descriptions of the specification, the drawings, the claims, and the like, and other effects can be derived from the descriptions of the specification, the drawings, the claims, and the like.

BRIEF DESCRIPTION OF THE DRAWINGS

FIG. 2A and FIG. 2B are conceptual diagrams of an active matrix light-emitting apparatus.

FIG. 5A, FIG. 5B1, FIG. 5B2, and FIG. 5C are diagrams illustrating electronic devices.

MODE FOR CARRYING OUT THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Embodiment 1

In this embodiment, a light-emitting device of one embodiment of the present invention is described.

Figure 1A:
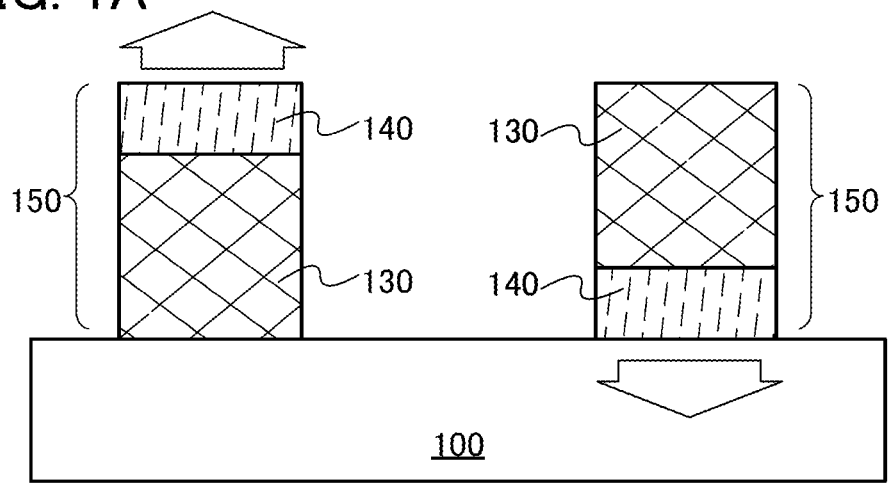
FIG. 1A, FIG. 1B, and FIG. 1C are schematic diagrams of light-emitting devices.

FIG. 1A is a diagram illustrating a light-emitting device 150 of one embodiment of the present invention. The light-emitting device of the present invention is formed over an insulating surface 100 and includes an organic EL device 130 and a first layer 140 that is provided in contact with an electrode to which light is emitted from the organic EL device 130.

The organic EL device 130 is an EL device that emits light by making a current flow between the electrodes, using an organic compound as a light-emitting substance. The organic EL device of one embodiment of the present invention emits light having an emission spectrum peak in a wavelength range of greater than or equal to 750 nm and less than or equal to 1000 nm.

The insulating surface 100 may be a surface of a substrate such as glass or quartz or a surface of an insulating film provided over another element such as a transistor. Note that the electrode included in the organic EL device 130 is electrically connected to a transistor or another element through a wiring provided over the insulating surface 100 or a conductive layer provided in part of the insulating surface 100.

The first light-emitting layer 140 is a layer containing an organic compound. The extinction coefficient k of the first layer 140 has the local maximum value in the visible light region. When the first layer 140 that is a layer containing an organic compound is formed, a step of the refractive indexes n between the electrode of the organic EL device 130 and an external atmosphere can be small, and thus the extraction efficiency is improved. The first layer 140 has the local maximum value of the extinction coefficient k in the visible light region, whereby the first layer 140 has absorption in the visible light region; therefore, light in the visible light region that is emitted from the light-emitting device 150 is reduced, and the light-emitting device 150 can be a light source of near-infrared light that is less likely to be seen. Furthermore, when the first layer 140 includes an organic compound that can be deposited by evaporation, the first layer 140 can be formed by evaporation. Accordingly, the first layer 140 can be formed without separation from the evaporation steps of the organic EL device 130; thus, a light-emitting device with improved extraction efficiency can be manufactured simply and inexpensively.

Note that the maximum value of the extinction coefficient k in the visible light region of the first layer 140 is preferably greater than or equal to 0.05, further preferably greater than or equal to 0.2.

Furthermore, the refractive index n of the first layer 140 is preferably greater in a peak wavelength of the emission spectrum of the organic EL device 130, and is preferably greater than or equal to 1.9.

As the organic compound for forming the first layer 140, a phthalocyanine-based material such as copper phthalocyanine (abbreviation: CuPc), a perylene derivative such as 5,10,15,20-tetraphenylbisbenzo[5,6]indeno[1,2,3-cd:1',2',3'-lm]perylene (abbreviation: DBP) or 3,4,9,10-perylenetetracarboxyl-bis-benzimidazole (abbreviation: PTCBI), a fullerene-based material such as C60 or C70, condensed aromatic hydrocarbon including four or more rings such as pyrene, or the like can be favorably used.

Figure 1B:
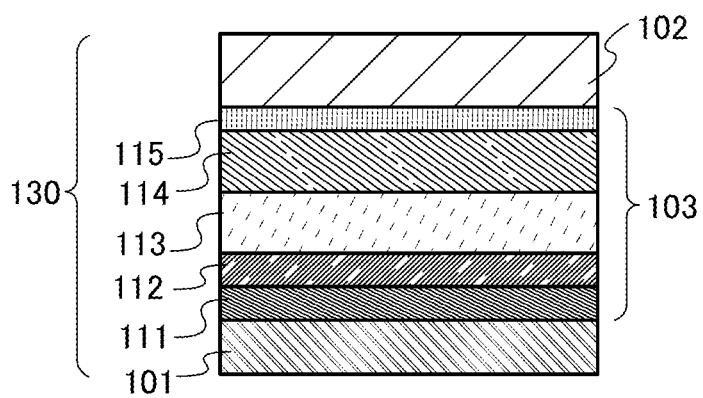

As illustrated in FIG. 1B, the organic EL device 130 includes an anode 101, a cathode 102, and an EL layer 103. The EL layer 103 includes a light-emitting layer 113 containing an organic compound as a light-emitting material, and emits light having an emission spectrum peak in a wavelength range of greater than or equal to 750 nm and less than or equal to 1000 nm.

One of the anode 101 and the cathode 102 is an electrode having a transmitting property in the peak wavelength of light emitted from the EL layer 103. The first layer 140 is provided in contact with a surface of the electrode having a transmitting property, which is opposite to a surface facing the EL layer 103.

The electrode having a transmitting property is preferably a transflective electrode having a reflective property with respect to the peak wavelength of light emitted from the EL layer 103. Note that the other electrode of the anode 101 and the cathode 102, which is not the electrode having a transmitting property, is preferably an electrode having a reflective property with respect to the peak wavelength of light of emitted from the EL layer 103. This structure enables a microcavity structure in which light emitted from the light-emitting layer 113 is reflected between the anode 101 and the cathode 102; and appropriate adjustment of the optical path length of the organic EL device 130 can narrow the half width of the emission spectrum, and the intensity of light with an intended wavelength can be increased.

Note that the reflective electrode is a film having a reflectivity in the peak wavelength of light emitted from the EL layer 103 of 40% to 100%, preferably 70% to 100%, and a resistivity of $1\times10^{-2}$ Ωcm or lower. In the case of fabricating a microcavity structure, the transflective electrode is a film having a resistivity in the peak wavelength of light emitted from the EL layer 103 of 20% to 80%, preferably 40% to 70%, and a resistivity of $1\times10^{-2}$ Ωcm or lower.

In the light-emitting device, by changing thicknesses of the transparent conductive film, the above-described composite material, the carrier-transport material, and the like, the optical path length between the reflective electrode and the transflective electrode (the optical path length of the organic EL device 130) can be changed. Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transflective electrode from the light-emitting layer 113 (first incident light); therefore, the optical path length between the reflective electrode and the light-emitting layer is preferably adjusted to $(2n-1)\lambda/4$ (n is a natural number of 1 or larger and λ is a wavelength of light emission to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer; for example, in combination with the structure of the tandem light-emitting device described later, a plurality of EL layers each including a single or a plurality of light-emitting layer(s) may be provided in one light-emitting device with a charge-generation layer interposed between the EL layers.

Figure 1C:
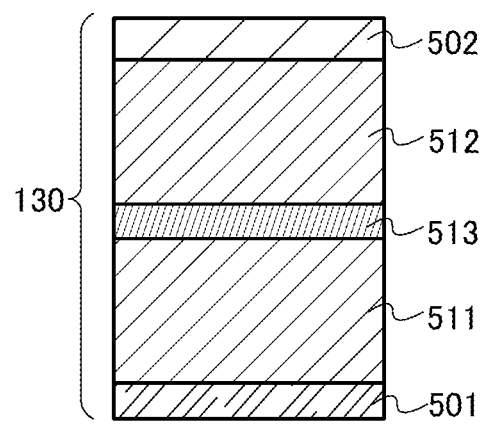

Next, the organic EL device 130 is described with reference to FIG. 1B and FIG. 1C. In FIG. 1B and FIG. 1C, a hole-injection layer, a hole-transport layer, the light-emitting layer, an electron-transport layer, and an electron-injection layer are illustrated, with the anode 101 as the bottom and the cathode 102 as the top, in this order from the bottom; however, these stacking order may be reversed upside down. The electrode having a transmitting property may be any of the anode 101 and the cathode 102.

Note that although FIG. 1B illustrates a hole-injection layer 111, and a hole-transport layer 112, an electron-transport layer 114, and an electron-injection layer 115 in the EL layer 103 in addition to the light-emitting layer 113, the structure of the EL layer 103 is not limited thereto. Any of these layers may be omitted or a layer having another function may be included.

Next, examples of specific structures and materials of the above light-emitting device are described. The light-emitting device of one embodiment of the present invention includes, as described above, the EL layer 103 including a plurality of layers between the pair of electrodes of the anode 101 and of the cathode 102.

The anode 101 is preferably formed using a metal, an alloy, or a conductive compound having a high work function (specifically, 4.0 eV or more), a mixture thereof, or the like. Specifically, for example, indium oxide-tin oxide (ITO: Indium Tin Oxide), indium oxide-tin oxide containing silicon or silicon oxide, indium oxide-zinc oxide, indium oxide containing tungsten oxide and zinc oxide (IWZO), and the like can be given. These conductive metal oxide films are usually formed by a sputtering method but may also be formed by application of a sol-gel method or the like. An example of the formation method is a method in which indium oxide-zinc oxide is formed by a sputtering method using a target in which 1 to 20 wt % zinc oxide is added to indium oxide. Indium oxide containing tungsten oxide and zinc oxide (IWZO) can also be formed by a sputtering method using a target containing 0.5 to 5 wt % tungsten oxide and 0.1 to 1 wt % zinc oxide with respect to indium oxide. Alternatively, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), and the like can be given. Graphene can also be used. Note that when a composite material described later is used for a layer that is in contact with the anode 101 in the EL layer 103, an electrode material can be selected regardless of its work function.

Although the EL layer 103 preferably has a stacked-layer structure, there is no particular limitation on the stacked-layer structure, and various layer structures such as a hole-injection layer, a hole-transport layer, a light-emitting layer, an electron-transport layer, an electron-injection layer, a carrier-blocking layer, an exciton-blocking layer, and a charge-generation layer can be employed. In this embodiment, as illustrated in FIG. 1B, a structure is described in which the electron-transport layer 114 and the electron-injection layer 115 are included in addition to the hole-injection layer 111, the hole-transport layer 112, and the light-emitting layer 113. Materials forming the layers are specifically described below.

The hole-injection layer 111 contains a substance having an acceptor property. Either an organic compound or an inorganic compound can be used as the substance having an acceptor property.

As the substance having an acceptor property, a compound having an electron-withdrawing group (a halogen group or a cyano group) can be used; 7,7,8,8-tetracyano-2,3,5,6-tetrafluoroquinodimethane (abbreviation: F$_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), 2-(7-dicyanomethylene-1,3,4,5,6,8,9,10-octafluoro-7H-pyren-2-ylidene)malononitrile, and the like can be given. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a halogen group such as a fluoro group, or a cyano group) has a very high electron-accepting property and thus is preferable. Specific examples include α,α',α''-1,2,3-cyclopropanetriylidenetris[4-cyano-2,3,5,6-tetrafluorobenzeneacetonitrile], α,α',α''-1,2,3-cyclopropanetriylidenetris[2,6-dichloro-3,5-difluoro-4-(trifluoromethyl)benzeneacetonitrile], and α,α',α''-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. Alternatively, the hole-injection layer 111 can be formed using a phthalocyanine-based complex compound such as phthalocyanine (abbreviation: H$_2$Pc) or copper phthalocyanine (CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), or a high molecule such as poly(3,4-ethylenedioxythiophene)/poly(styrenesulfonic acid) (PEDOT/PSS). The substance having an acceptor property can extract electrons from an adjacent hole-transport layer (or hole-transport material) by the application of an electric field.

Alternatively, a composite material in which a material having a hole-transport property contains the above-described acceptor substance can be used for the hole-injection layer 111. By using a composite material in which a material having a hole-transport property contains an acceptor substance, a material used to form an electrode can be selected regardless of its work function. In other words, besides a material having a high work function, a material having a low work function can also be used for the anode 101.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the material having a hole-transport property used for the composite material preferably has a hole mobility of $1\times10^{-6}$ cm$^2$/Vs or higher. Organic compounds which can be used as the material having a hole-transport property in the composite material are specifically given below.

Examples of the aromatic amine compounds that can be used for the composite material include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B). Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)]phenyl-10-phenylanthracene (abbreviation: CzPA), and 1,4-bis[4-(N-carbazolyl)phenyl]-2,3,5,6-tetraphenylbenzene. Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis (4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra (tert-butyl)perylene. Other examples include pentacene and coronene. The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples include high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis (phenyl)benzidine] (abbreviation: Poly-TPD).

The material having a hole-transport property used for the composite material further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that has a naphthalene ring, or an aromatic monoamine in which a 9-fluorenyl group is bonded to nitrogen of the amine through an arylene group may be used. Note that these second organic compounds are preferably substances having an N,N-bis(4-biphenyl)amino group because a light-emitting device with a long lifetime can be manufactured. Specific examples of the above second organic compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b] naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA (βN2)B-03), 4,4'-diphenyl-4"-(4;2'-binaphthyl-1-yl) triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris (1,1'-biphenyl-4-yl)amine (abbreviation: YGTBi1BP-02), 4-diphenyl-4'-(2-naphthyl)-4"-{9-(4-biphenylyl)carbazole)}triphenylamine (abbreviation: YGTBiβNB), N-[4-(9-phenyl-9H-carbazol-3-yl)phenyl]-N-[4-(1-naphthyl)phenyl]-9,9'-spirobi(9H-fluoren)-2-amine (abbreviation: PCBNBSF), N,N-bis(4-biphenylyl)-9,9'-spirobi[9H-fluoren]-2-amine (abbreviation: BBASF), N,N-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi(9H-fluoren)-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl) phenyl]-N-[3-(6-phenyldibenzofuran-4-yl)phenyl]-1-naphthylamine (abbreviation: mPDBfBNBN), 4-phenyl-4'-(9- phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-9,9-dimethyl-N-[4-(9-phenyl-9H-carbazol-3-yl)phenyl]-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Note that it is further preferable that the material having a hole-transport property used for the composite material have a relatively deep HOMO level greater than or equal to −5.7 eV and less than or equal to −5.4 eV. The relatively deep HOMO level of the material having a hole-transport property used for the composite material makes it easy to inject holes into the hole-transport layer 112 and to obtain a light-emitting device with a long lifetime.

Note that mixing the above composite material with a fluoride of an alkali metal or an alkaline earth metal (the proportion of fluorine atoms in the layer is preferably greater than or equal to 20%) can lower the refractive index of the layer. This also enables a layer with a low refractive index to be formed in the EL layer 103, leading to higher external quantum efficiency of the light-emitting device.

The formation of the hole-injection layer 111 can improve the hole-injection property, whereby a light-emitting device having a low driving voltage can be obtained. The organic compound having an acceptor property is an easy-to-use material because evaporation is easy and its film can be easily formed as compared with the metal or the fluoride of metal. As such organic compound, 1,1-bis-(4-bis(4-methylphenyl)-amino-phenyl)-cyclohexane (abbreviation: TAPC), 4,4'-(1,1-cyclohexane-diyl)bis[N,N-bis-4-cyclohexylbenzen-1-yl)aminobenzene] (abbreviation: TAPC-02), 4,4'-(1,1-cyclohexane-diyl)bis{N-(4-cyclohexylphenyl)N-[(4'-cyclohexyl)-1,1'-biphenyl-4-yl]aminobenzene} (abbreviation: TAPC-03), and the like can be used, in addition to N,N-bis(4-cyclohexylphenyl)-N-(9,9-dimethyl-9H-fluoren-2yl) amine (abbreviation: dchPAF), N-(4-cyclohexylphenyl)-N-(4'-cyclohexyl-1,1'-biphenyl-4-yl)-N-(9,9-dimethyl-9H-fluoren-2yl)amine (abbreviation: chBichPAF), N,N-bis(4-cyclohexylphenyl)-N-(spiro[cyclohexane-1,9'[9H]fluoren]-2'-yl)amine (abbreviation: dchPASchF), N-[(4'-cyclohexyl)-1,1'-biphenyl-4-yl]-N-(4-cyclohexylphenyl)-N-(spiro[cyclohexane-1,9'-[9H]-fluoren]-2'-yl)-amine (abbreviation: chBichPASchF), N-(4-cyclohexylphenyl)-N,N-bis(spiro[cyclohexane-1,9'-[9H]-fluoren-2'-yl]amine (abbreviation: SchFB1chP), N-(4-cyclohexylphenyl)-N-(3'',5''-ditertiary-butyl-1,1''-biphenyl-4-yl)-N-(9,9-dimethyl-9H-fluoren-2yl) amine (abbreviation: mmtBuBichPAF), N,N-bis(3',5'-ditertiarybutyl-1,1'-biphenyl-4-yl)-N-(9,9-dimethyl-9H-fluoren-2-yl)amine (abbreviation: dmmtBuBiAF), N-(3',5'-ditertiarybutyl-1,1'-biphenyl-4-yl)-N-(3,5-ditertiarybutylbenzen-1-yl)-N-(9,9-dimethyl-9H-fluoren-2-yl)amine (abbreviation: mmtBuBimmtBuPAF), N,N-bis(4-cyclohexylphenyl)-N-(9,9-dipropyl-9H-fluoren-2-yl)amine (abbreviation: dchPAPrF), N-[(3',5'-dicyclohexyl)-1,1'-biphenyl-4-yl]-N-(4-cyclohexylphenyl)-9,9-dimethyl-9H-fluoren-2-amine (abbreviation: mmchBichPAF), N-(3,3'',5,5''-tetra-t-butyl-1,1':3',1''-terphenyl-5'-yl)-N-(4-cyclohexylphenyl)-9,9-dimethyl-9H-fluoren-2-amine (abbreviation: mmtBumTPchPAF), N-(4-cyclododecylphenyl)-N-(4-cyclohexylphenyl)-9,9-dimethyl-9H-fluoren-2-amine (abbreviation: CdoPchPAF), and the like.

The hole-transport layer 112 contains a material having a hole-transport property. The material having a hole-transport property preferably has a hole mobility of $1 \times 10^{-6}$ cm$^2$/Vs or more. As the material having a hole-transport property, a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF), a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP), a compound having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV), and a compound having a furan skeleton, such as 4,4',4''-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II) can be given. Among the above, the compound having an aromatic amine skeleton and the compound having a carbazole skeleton are preferable because these have favorable reliability, have high hole-transport properties, and contribute to a reduction in driving voltage. Note that any of the substances given as examples of the material having a hole-transport property that is used for the composite material for the hole-injection layer 111 can also be suitably used as the material included in the hole-transport layer 112.

Similarly, any of the materials with low refractive index given as examples of the material having a hole-transport property that is used for the composite material for the hole-injection layer 111 can also be used, and also when the materials are used for the hole-transport layer 112, extraction efficiency can be improved, so that a light-emitting device with high emission efficiency can be provided.

The light-emitting layer 113 contains a light-emitting substance and a host material. The light-emitting layer 113 may additionally contain other materials. Furthermore, the light-emitting layer 113 may be a stack of two layers with different compositions.

The light-emitting substance may be fluorescent substances, phosphorescent substances, substances exhibiting thermally activated delayed fluorescence (TADF), or other light-emitting substances. However, in the case where the light-emitting device of one embodiment of the present invention emits light having an emission peak in a wavelength range of greater than or equal to 750 nm and less than or equal to 1000 nm from the EL layer, it is preferable to use an organic compound (e.g., an organometallic complex) having an emission peak in the wavelength range of greater than or equal to 750 nm and less than or equal to 1000 nm for the light-emitting layer. Alternatively, for example, a phthalocyanine compound (central metal: e.g., aluminum or zinc), a naphthalocyanine compound, a dithiolene compound (central metal: nickel), a quinone-based compound, a diimonium-based compound, or an azo-based compound can be used.

Note that as the organometallic complex having an emission peak in the wavelength range of greater than or equal to 750 nm and less than or equal to 1000 nm, an organometallic complex represented by General Formula (G1) below can be given, for example.

[Chemical Formula 1]

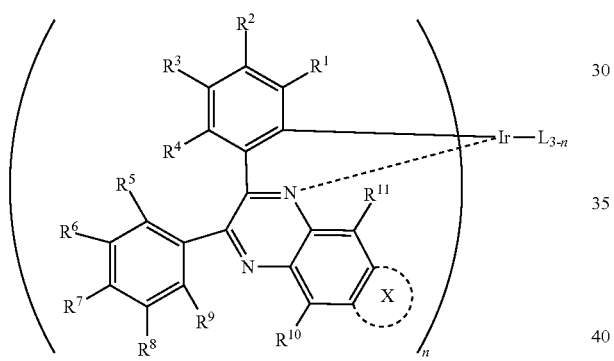

G1

In General Formula (G1), each of $R^1$ to $R^{11}$ independently represents hydrogen or an alkyl group having 1 to 6 carbon atoms; at least two of $R^1$ to $R^4$ represent an alkyl group having 1 to 6 carbon atoms; at least two of $R^5$ to $R^9$ represent an alkyl group having 1 to 6 carbon atoms; X represents a substituted or unsubstituted benzene ring or naphthalene ring; n is 2 or 3; and L represents a monoanionic ligand.

Examples of the alkyl group having 1 to 6 carbon atoms in General Formula (G1) include a methyl group, an ethyl group, a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a 3-methylpentyl group, a 2-methylpentyl group, a 2-ethylbutyl group, a 1,2-dimethylbutyl group, and a 2,3-dimethylbutyl group.

When the benzene ring or the naphthalene ring has a substituent in General Formula (G1), the substituent can be an alkyl group having 1 to 6 carbon atoms. The above description can be referred to for the alkyl group having 1 to 6 carbon atoms.

Examples of the monoanionic ligand include a monoanionic bidentate chelate ligand having a β-diketone structure, a monoanionic bidentate chelate ligand having a carboxyl group, a monoanionic bidentate chelate ligand having a phenolic hydroxyl group, a monoanionic bidentate chelate ligand in which two ligand elements are both nitrogen, and a bidentate ligand that forms a metal-carbon bond with iridium by cyclometalation.

The monoanionic ligand is preferably any one of General Formulae (L1) to (L8).

[Chemical Formula 2]

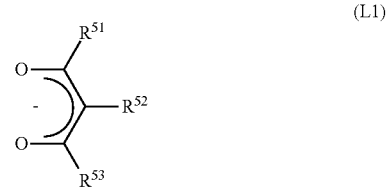

(L1)

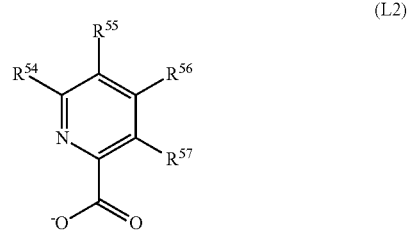

(L2)

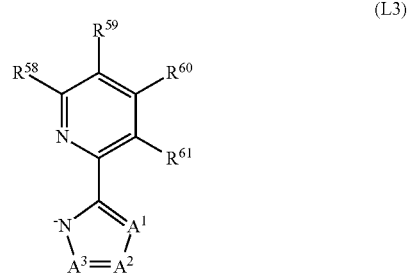

(L3)

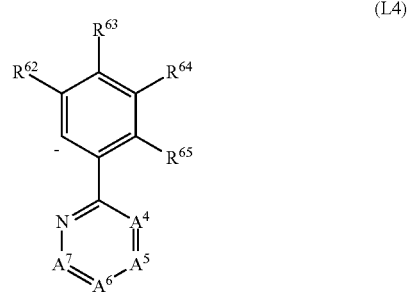

(L4)

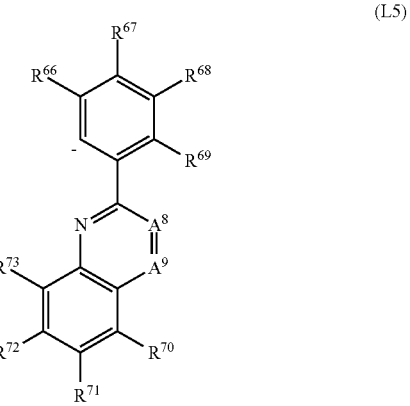

(L5)

(L6)
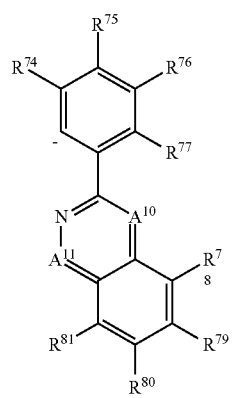

(L7)
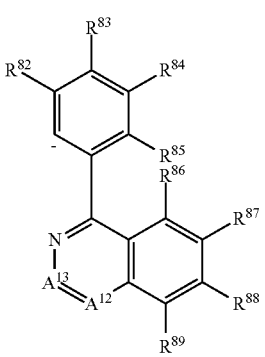

(L8)
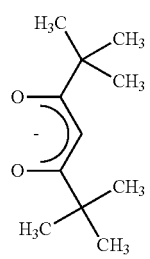

[Chemical Formula 3]

(100)
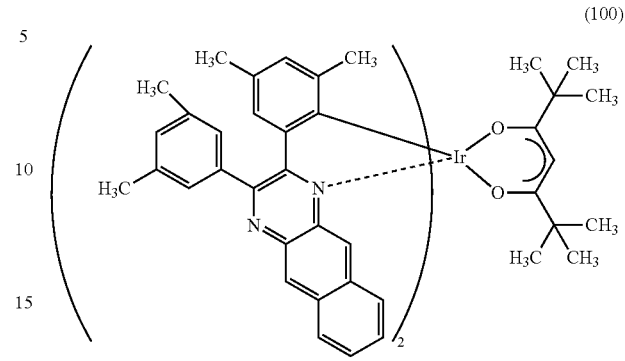

(101)
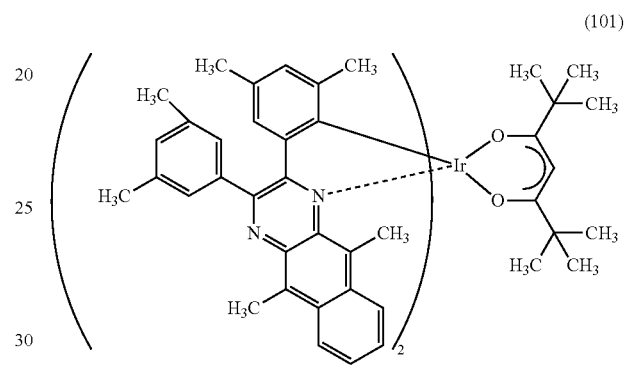

(102)
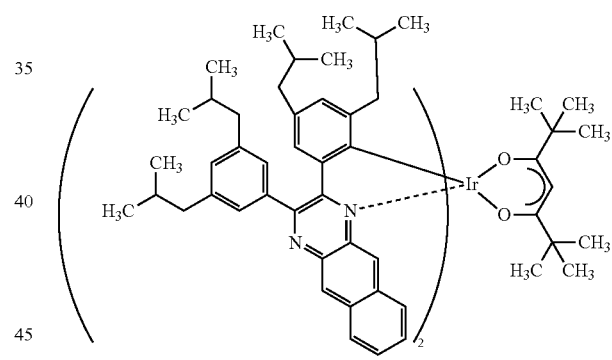

(103)
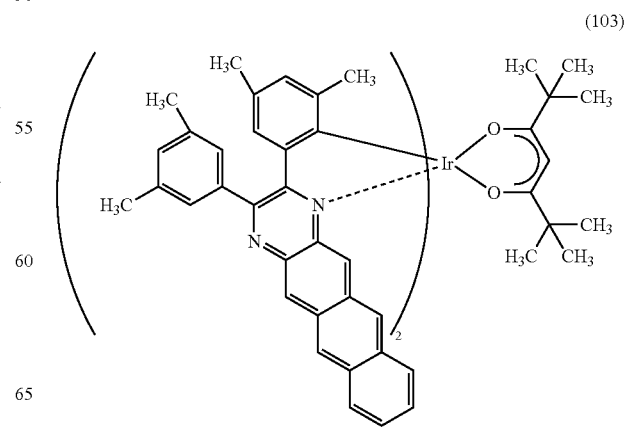

In General Formulae (L1) to (L8), each of $R^{51}$ to $R^{89}$ independently represents hydrogen, a substituted or unsubstituted alkyl group having 1 to 6 carbon atoms, a halogeno group, a vinyl group, a substituted or unsubstituted haloalkyl group having 1 to 6 carbon atoms, a substituted or unsubstituted alkoxy group having 1 to 6 carbon atoms, a substituted or unsubstituted alkylthio group having 1 to 6 carbon atoms, or a substituted or unsubstituted aryl group having 6 to 13 carbon atoms; each of $A^1$ to $A^{13}$ independently represents nitrogen, sp² hybridized carbon bonded to hydrogen, or sp² hybridized carbon having a substituent; and the substituent represents any of an alkyl group having 1 to 6 carbon atoms, a halogeno group, a haloalkyl group having 1 to 6 carbon atoms, and a phenyl group.

Note that specific examples of the organometallic complex represented by General Formula (G1) above include organometallic complexes represented by Structural Formula (100) to Structural Formula (107). Note that the present invention is not limited thereto.

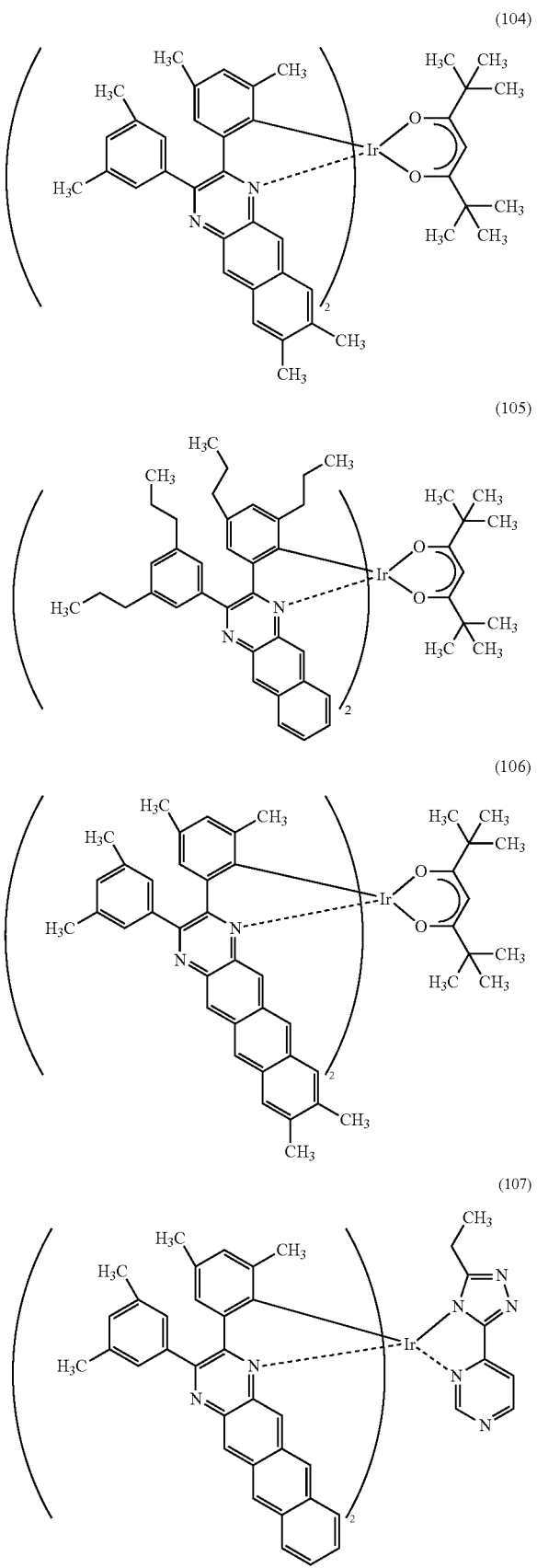

In the case where a substance other than the above organometallic complex is used as a light-emitting substance, examples of a material that can be used as a fluorescent substance in the light-emitting layer 113 include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N",N",N'",N'"-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-(pyrene-1,6-diyl)bis[(6,N-diphenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf (IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). In particular, a condensed aromatic diamine compound typified by a pyrene-diamine compound such as 1,6FLPAPrn, 1,6mMemFLPA-Prn, and 1,6BnfAPrn-03 is preferable because of its high hole-trapping property, high emission efficiency, and high reliability. Fluorescent substances other than those can also be used.

In the case where a phosphorescent substance is used as a light-emitting substance in the light-emitting layer 113, examples of a material that can be used include an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), and tris[4-(3-biphenyl)-5-isopropyl-3-phenyl-4H-1,2,4-triazolato]iridium(III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIracac). These compounds emit blue phosphorescence having an emission spectrum peak at 440 nm to 520 nm.

Examples also include an organometallic iridium complex having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), or (acetylacetonato)bis(4,6-diphenylpyrimidinato)iridium(III) (abbreviation: [Ir(dppm)$_2$(acac)]), an organometallic iridium complex having a pyrazine skeleton, such as (acetylacetonato)bis(3,5-dimethyl-2-phenylpyrazinato)iridium(III) (abbreviation: [Ir(mppr-Me)$_2$(acac)]) or (acetylacetonato)bis(5-isopropyl-3-methyl-2-phenylpyrazinato)iridium(III) (abbreviation: [Ir(mppr-iPr)$_2$(acac)]), an organometallic iridium complex having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]), and a rare earth metal complex such as tris(acetylacetonato)(monophenanthroline)terbium(III) (abbreviation: [Tb(acac)$_3$(Phen)]). These compounds mainly emit green phosphorescence having an emission spectrum peak at 500 nm to 600 nm. Note that an organometallic iridium complex having a pyrimidine skeleton is particularly preferable because of its distinctively high reliability and emission efficiency.

Examples also include an organometallic iridium complex having a pyrimidine skeleton, such as (diisobutyryl-methanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), or bis[4,6-di(naphthalen-1-yl)pyrimidinato](dipivaloylmethanato)iridium(III) (abbreviation: [Ir(d1npm)$_2$(dpm)]), an organometallic iridium complex having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), or (acetylacetonato)bis[2,3-bis(4-fluorophenyl)quinoxalinato]iridium(III) (abbreviation: [Ir(Fdpq)$_2$(acac)]), an organometallic iridium complex having a pyridine skeleton, such as tris(1-phenylisoquinolinato-N,C$^{2'}$)iridium(III) (abbreviation: [Ir(piq)$_3$]) or bis(1-phenylisoquinolinato-N,C$^{2'}$)iridium(III) acetylacetonate (abbreviation: [Ir(piq)$_2$(acac)]), a platinum complex such as 2,3,7,8,12,13,17,18-octaethyl-21H,23H-porphyrin platinum(II) (abbreviation: PtOEP), and a rare earth metal complex such as tris(1,3-diphenyl-1,3-propanedionato)(monophenanthroline)europium(III) (abbreviation: [Eu(DBM)$_3$(Phen)]) or tris[1-(2-thenoyl)-3,3,3-trifluoroacetonato](monophenanthroline)europium(III) (abbreviation: [Eu(TTA)$_3$(Phen)]). These compounds emit red phosphorescence having an emission spectrum peak at 600 nm to 700 nm. Furthermore, from the organometallic iridium complex having a pyrazine skeleton, red light emission with favorable chromaticity can be obtained.

Besides the above-described phosphorescent compounds, other known phosphorescent substances may be selected and used.

As the TADF material, a fullerene, a derivative thereof, an acridine, a derivative thereof, an eosin derivative, or the like can be used. Other examples include a metal-containing porphyrin containing magnesium (Mg), zinc (Zn), cadmium (Cd), tin (Sn), platinum (Pt), indium (In), palladium (Pd), or the like. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP), which are represented by the following structural formulae.

[Chemical Formula 4]
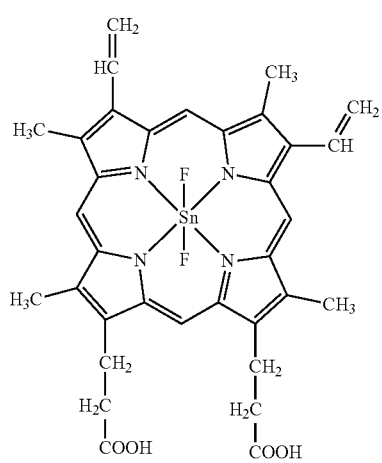
SnF$_2$(Proto IX)
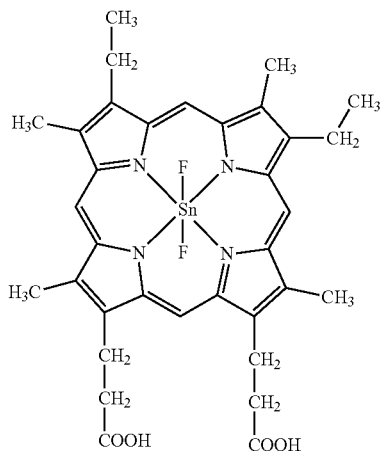
SnF$_2$(Meso IX)
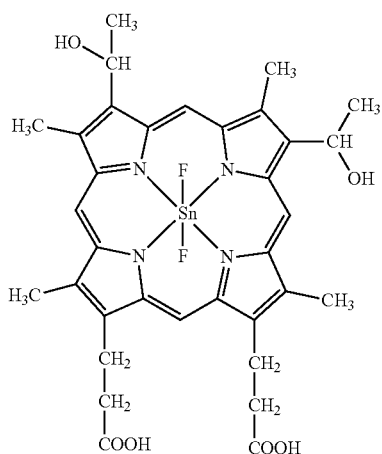
SnF$_2$(Hemato IX)
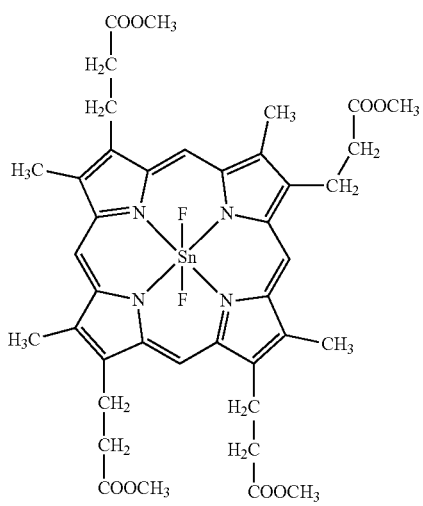
SnF$_2$(Copro III-4Me)
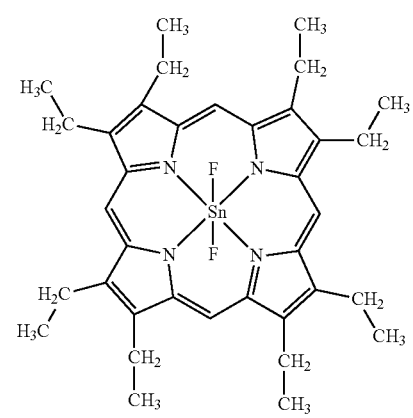
SnF$_2$(OEP)
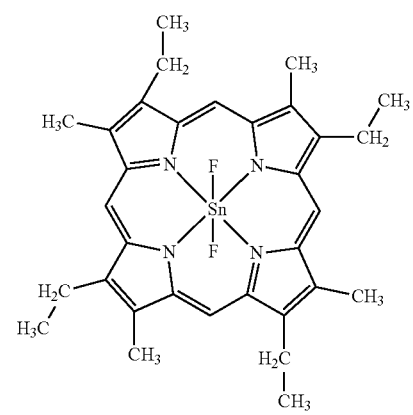
SnF$_2$(Etio I)

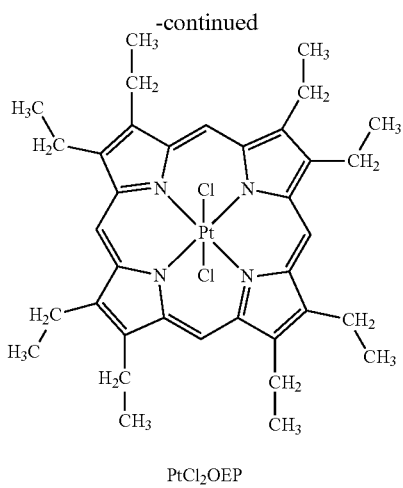

PtCl₂OEP

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. These heterocyclic compounds are preferable because of having both a high electron-transport property and a high hole-transport property owing to the π-electron rich heteroaromatic ring and the π-electron deficient heteroaromatic ring. Among skeletons having a π-electron deficient heteroaromatic ring, a pyridine skeleton, a diazine skeleton (a pyrimidine skeleton, a pyrazine skeleton, and a pyridazine skeleton), and a triazine skeleton are particularly preferable because of their high stability and reliability. In particular, a benzofuropyrimidine skeleton, a benzothienopyrimidine skeleton, a benzofuropyrazine skeleton, and a benzothienopyrazine skeleton are preferable because of their high acceptor property and reliability. Among skeletons having a π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. Note that a dibenzofuran skeleton and a dibenzothiophene skeleton are preferable as the furan skeleton and the thiophene skeleton, respectively. As the pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which a π-electron rich heteroaromatic ring and a π-electron deficient heteroaromatic ring are directly bonded to each other is particularly preferable because the electron-donating property of the π-electron rich heteroaromatic ring and the electron-accepting property of the π-electron deficient heteroaromatic ring are both increased and the energy difference between the S1 level and the T1 level becomes small, and thus thermally activated delayed fluorescence can be obtained efficiently. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 5]

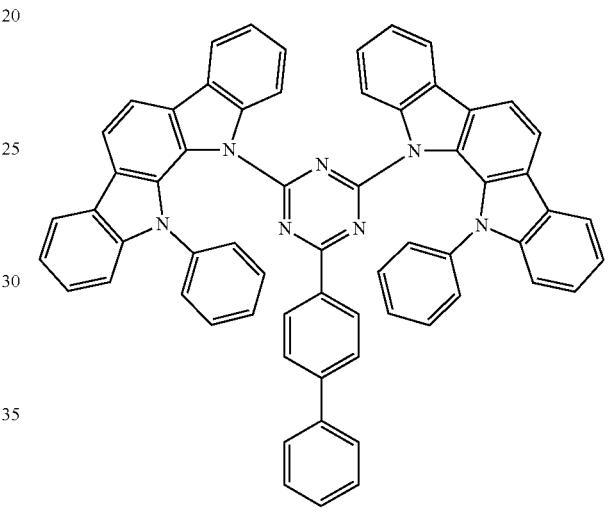

PIC-TRZ

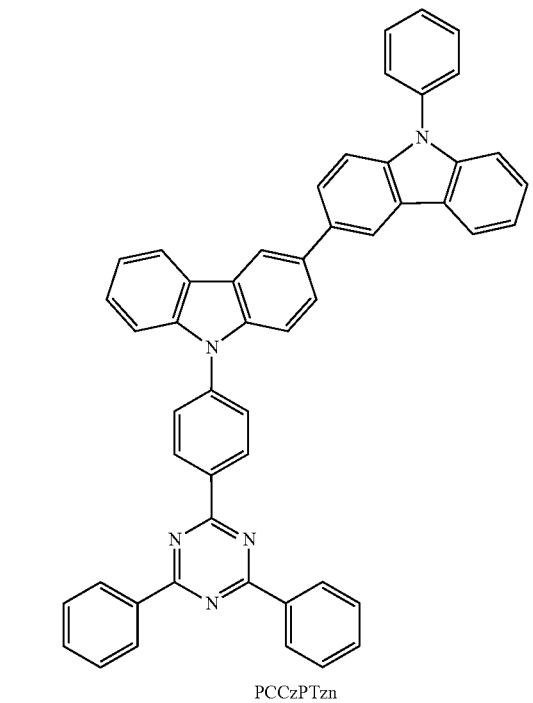

PCCzPTzn

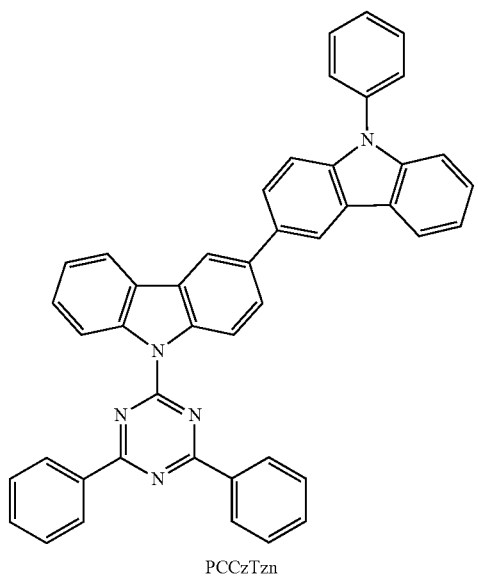

PCCzTzn

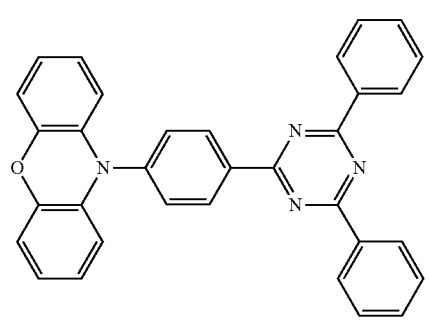

PXZ-TRZ

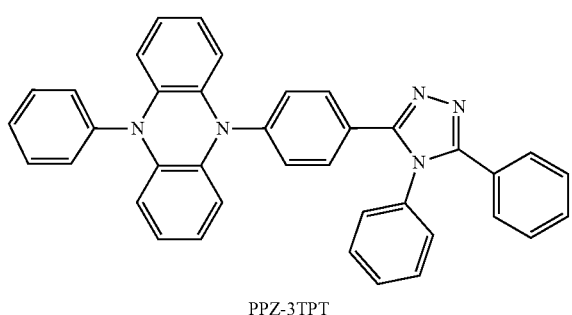

PPZ-3TPT

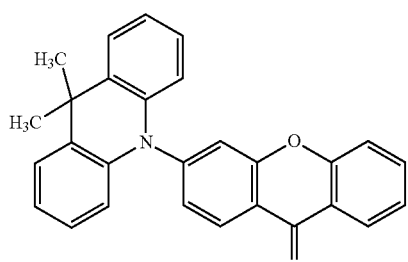

ACRXTN

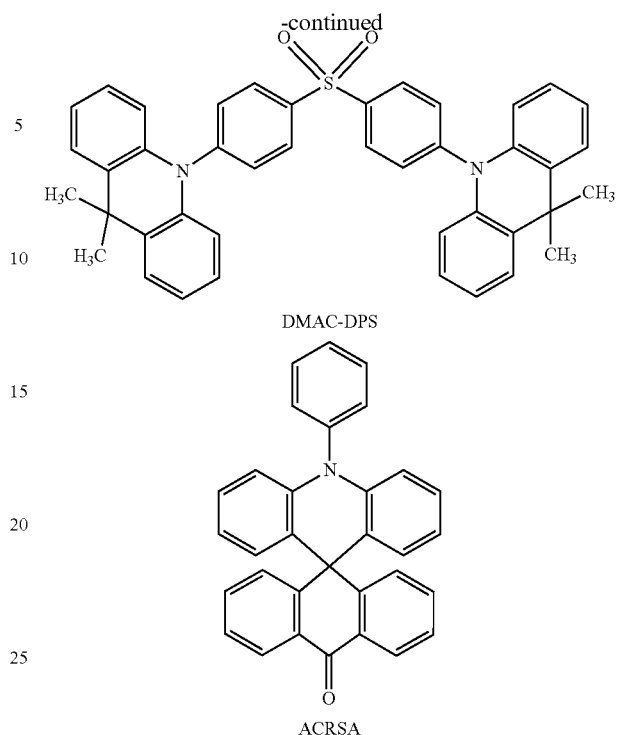

DMAC-DPS

ACRSA

Note that the TADF material is a material that has a small difference between the S1 level and the T1 level and has a function of converting triplet excitation energy into singlet excitation energy by reverse intersystem crossing. Thus, it is possible to upconvert triplet excitation energy into singlet excitation energy (reverse intersystem crossing) using a little thermal energy and to efficiently generate a singlet excited state. In addition, the triplet excitation energy can be converted into light emission.

An exciplex whose excited state is formed by two kinds of substances has an extremely small difference between the S1 level and the T1 level and has a function of a TADF material that can convert triplet excitation energy into singlet excitation energy.

Note that a phosphorescent spectrum observed at low temperatures (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between S1 and T1 of the TADF material is preferably less than or equal to 0.3 eV, further preferably less than or equal to 0.2 eV.

When the TADF material is used as a light-emitting substance, the S1 level of the host material is preferably higher than the S1 level of the TADF material. In addition, the T1 level of the host material in the case of using the TADF material as a light-emitting substance is preferably higher than the T1 level of the TADF material.

As the host material in the light-emitting layer, various carrier-transport materials such as a material having an electron-transport property, a material having a hole-transport property, and the TADF material can be used.

The material having a hole-transport property is preferably an organic compound having an amine skeleton or a π-electron rich heteroaromatic ring skeleton. Examples include a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF), a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP), a compound having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV), and a compound having a furan skeleton, such as 4,4',4''-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above, the compound having an aromatic amine skeleton and the compound having a carbazole skeleton are preferable because these have favorable reliability, have high hole-transport properties, and contribute to a reduction in driving voltage. Any of the materials having a hole-transport property given as examples of the material that can be used for the composite material can also be used.

As the material having an electron-transport property, for example, a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); or an organic compound having a π-electron deficient heteroaromatic ring skeleton is preferable. Examples of the organic compound having a π-electron deficient heteroaromatic ring skeleton include a heterocyclic compound having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II), a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), or 4,8-bis[3-(dibenzothiophen-4-yl)phenyl]benzo[h]quinazoline (abbreviation: 4,8mDBtP2Bqn), and a heterocyclic compound having a pyridine skeleton, such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB). Among the above, the heterocyclic compound having a diazine skeleton and the heterocyclic compound having a pyridine skeleton have favorable reliability and thus are preferable. In particular, the heterocyclic compound having a diazine (pyrimidine or pyrazine) skeleton has a high electron-transport property and contributes to a reduction in driving voltage.

As the TADF material that can be used as the host material, the above-mentioned materials given as TADF materials can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. At this time, the TADF material functions as an energy donor, and the light-emitting substance functions as an energy acceptor.

This is very effective in the case where the light-emitting substance is a fluorescent substance. In that case, the S1 level of the TADF material is preferably higher than the S1 level of the fluorescent substance in order to achieve high emission efficiency. Furthermore, the T1 level of the TADF material is preferably higher than the S1 level of the fluorescent substance. Therefore, the T1 level of the TADF material is preferably higher than the T1 level of the fluorescent substance.

It is also preferable to use a TADF material that exhibits light emission overlapping with the wavelength of a lowest-energy-side absorption band of the fluorescent substance. This enables smooth transfer of excitation energy from the TADF material to the fluorescent substance and accordingly enables efficient light emission, which is preferable.

In order that singlet excitation energy is efficiently generated from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton that causes light emission) of the fluorescent substance. As the protective group, a substituent having no π bond and saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituent having no π bond has a poor carrier-transport property; thus, the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

In the case where a fluorescent substance is used as the light-emitting substance, a material having an anthracene skeleton is suitable for the host material. The use of a substance having an anthracene skeleton as a host material for a fluorescent substance makes it possible to achieve a light-emitting layer with favorable emission efficiency and durability. As the substance having an anthracene skeleton that is used as the host material, a substance having a diphenylanthracene skeleton, in particular, a substance having a 9,10-diphenylanthracene skeleton, is preferable because of its chemical stability. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material having a dibenzocarbazole skeleton is preferable because its HOMO level is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole skeleton or a dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: αN-βNPAnth). In particular, CzPA, cgDBCzPA, 2mBnfPPA, and PCzPA are preferably selected because they exhibit excellent characteristics.

Note that a host material may be a material of a mixture of a plurality of kinds of substances; in the case of using a mixed host material, it is preferable to mix a material having an electron-transport property with a material having a hole-transport property. When the material having an electron-transport property is mixed with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1. Mixing of the material having an electron-transport property with the material having a hole-transport property may be conducted by co-evaporation or by evaporation of samples mixed in advance (premixed).

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed by these mixed materials. A combination is preferably selected so as to form an exciplex that exhibits light emission overlapping with the wavelength of a lowest-energy-side absorption band of a light-emitting substance, because energy can be transferred smoothly and light emission can be efficiently obtained. The use of the structure is preferable because the driving voltage is also be reduced.

Note that at least one of the materials forming an exciplex may be a phosphorescent substance. In this case, triplet excitation energy can be efficiently converted into singlet excitation energy by reverse intersystem crossing.

A combination of a material having an electron-transport property and a material having a hole-transport property whose HOMO level is higher than or equal to the HOMO level of the material having an electron-transport property is preferable for forming an exciplex efficiently. In addition, the LUMO level of the material having a hole-transport property is preferably higher than or equal to the LUMO level of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

Note that the formation of an exciplex can be confirmed by a phenomenon in which the emission spectrum of the mixed film in which the material having a hole-transport property and the material having an electron-transport property are mixed is shifted to the longer wavelength side than the emission spectrum of each of the materials (or has another peak on the longer wavelength side), observed by comparison of the emission spectrum of the material having a hole-transport property, the emission spectrum of the material having an electron-transport property, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the material having a hole-transport property, the transient PL of the material having an electron-transport property, and the transient PL of the mixed film of these materials. The transient PL can be rephrased as transient electroluminescence (EL). That is, the formation of an exciplex can also be confirmed by a difference in transient response observed by comparison of the transient EL of the material having a hole-transport property, the transient EL of the material having an electron-transport property, and the transient EL of the mixed film of these materials.

The electron-transport layer 114 is a layer containing a substance having an electron-transport property. As the substance having an electron-transport property, it is possible to use any of the above-listed substances having electron-transport properties that can be used as the host material.

The electron mobility of the electron-transport layer 114 in the case where the square root of the electric field strength

[V/cm] is 600 is preferably higher than or equal to $1\times10^{-7}$ cm$^2$/Vs and lower than or equal to $5\times10^{-5}$ cm$^2$/Vs. Lowering the electron-transport property of the electron-transport layer 114 enables control of the amount of electrons injected into the light-emitting layer and can prevent the light-emitting layer from having excess electrons. The electron-transport layer preferably includes a material having an electron-transport property and an alkali metal, an alkaline earth metal, a compound thereof, or a complex thereof. It is particularly preferable that this structure be employed when the hole-injection layer is formed using a composite material that includes a material having a hole-transport property with a relatively deep HOMO level of −5.7 eV or higher and −5.4 eV or lower, in which case a long lifetime can be achieved. Here, the material having an electron-transport property preferably has a HOMO level of −6.0 eV or higher. The material having an electron-transport property is preferably an organic compound having an anthracene skeleton and is further preferably an organic compound having both an anthracene skeleton and a heterocyclic skeleton. The heterocyclic skeleton is preferably a nitrogen-containing five-membered ring skeleton or a nitrogen-containing six-membered ring skeleton, and particularly preferably a nitrogen-containing five-membered ring skeleton or a nitrogen-containing six-membered ring skeleton including two heteroatoms in the ring, such as a pyrazole ring, an imidazole ring, an oxazole ring, a thiazole ring, a pyrazine ring, a pyrimidine ring, or a pyridazine ring. In addition, it is preferable that the alkali metal itself, the alkaline earth metal itself, the compound thereof, and the complex thereof have an 8-hydroxyquinolinato structure. Specific examples include 8-hydroxyquinolinato-lithium (abbreviation: Liq) and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, a methyl-substituted product (e.g., a 2-methyl-substituted product or a 5-methyl-substituted product) thereof or the like can also be used. There is preferably a difference in the concentration (including 0) of the alkali metal itself, the alkaline earth metal itself, the compound thereof, or the complex thereof in the electron-transport layer in the thickness direction.

As the electron-injection layer 115, a layer containing an alkali metal, an alkaline earth metal, or a compound thereof, such as lithium fluoride (LiF), cesium fluoride (CsF), calcium fluoride (CaF$_2$), or 8-hydroxyquinolinato-lithium (abbreviation: Liq), may be provided between the electron-transport layer 114 and the cathode 102. An electride or a layer that is formed using a substance having an electron-transport property and that includes an alkali metal, an alkaline earth metal, or a compound thereof can be used as the electron-injection layer 115. Examples of the electride include a substance in which electrons are added at high concentration to a mixed oxide of calcium and aluminum.

Note that as the electron-injection layer 115, it is possible to use a layer that contains a substance having an electron-transport property (preferably an organic compound having a bipyridine skeleton) and contains a fluoride of the alkali metal or the alkaline earth metal at a concentration higher than or equal to that at which the electron-injection layer 115 becomes in a microcrystalline state (50 wt % or higher). Since the layer has a low refractive index, a light-emitting device having more favorable external quantum efficiency can be provided.

Instead of the electron-injection layer 115, a charge-generation layer may be provided. The charge-generation layer refers to a layer capable of injecting holes into a layer in contact therewith on the cathode side and injecting electrons into a layer in contact therewith on the anode side when supplied with a potential. The charge-generation layer includes at least a P-type layer. The P-type layer is preferably formed using the composite materials given above as the material that can form the hole-injection layer. The P-type layer may be formed by stacking a film containing the above acceptor material as a material included in the composite material and a film containing the above hole-transport material. When a potential is applied to the P-type layer, electrons are injected into the electron-transport layer and holes are injected into the cathode 102 that is a cathode; thus, the light-emitting device operates.

Note that one or both of an electron-relay layer and an electron-injection buffer layer are preferably provided in the charge-generation layer in addition to the P-type layer.

The electron-relay layer contains at least a substance having an electron-transport property and has a function of preventing an interaction between the electron-injection buffer layer and the P-type layer to transfer electrons smoothly. The LUMO level of the substance having an electron-transport property contained in the electron-relay layer is preferably between the LUMO level of an acceptor substance in the P-type layer and the LUMO level of a substance contained in a layer of the electron-transport layer in contact with the charge-generation layer 116. A specific energy level of the LUMO level of the substance having an electron-transport property used for the electron-relay layer may be higher than or equal to −5.0 eV, preferably higher than or equal to −5.0 eV and lower than or equal to −3.0 eV Note that as the substance having an electron-transport property used for the electron-relay layer, a phthalocyanine-based material or a metal complex having a metal-oxygen bond and an aromatic ligand is preferably used.

For the electron-injection buffer layer, a substance having a high electron-injection property, such as an alkali metal, an alkaline earth metal, a rare earth metal, or a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)), can be used.

In the case where the electron-injection buffer layer is formed so as to contain the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)). Note that as the substance having an electron-transport property, a material similar to the above-described material forming the electron-transport layer 114 can be used for the formation.

As a substance forming the cathode 102, a metal, an alloy, an electrically conductive compound, or a mixture thereof having a low work function (specifically, 3.8 eV or less) or the like can be used. As specific examples of such a cathode material, elements belonging to Group 1 or Group 2 of the periodic table, such as alkali metals, e.g., lithium (Li) and cesium (Cs)), magnesium (Mg), calcium (Ca), and strontium (Sr), alloys containing these (MgAg and AlLi), rare earth metals such as europium (Eu) and ytterbium (Yb), alloys containing these rare earth metals, and the like can be given. However, when the electron-injection layer is provided between the cathode 102 and the electron-transport layer, as the cathode 102, a variety of conductive materials such as Al, Ag, ITO, or indium oxide-tin oxide containing silicon or silicon oxide can be used regardless of their work functions. Films of these conductive materials can be formed by a dry process such as a vacuum evaporation method or a sputtering method, an inkjet method, a spin coating method, or the like. Alternatively, the films may be formed by a wet process using a sol-gel method or a wet process using a paste of a metal material.

Various methods can be used as a method for forming the EL layer 103 regardless of whether it is a dry process or a wet process. For example, a vacuum evaporation method, a gravure printing method, an offset printing method, a screen printing method, an ink-jet method, a spin coating method, or the like may be used.

Different deposition methods may be used to form the electrodes or the layers described above.

The structure of the layers provided between the anode 101 and the cathode 102 is not limited to the above structure. However, a structure is preferable in which a light-emitting region where holes and electrons recombine is provided at a position away from the anode 101 and the cathode 102 so as to prevent quenching caused by the proximity of the light-emitting region and a metal used for electrodes and carrier-injection layers.

Furthermore, in order to inhibit energy transfer from an exciton generated in the light-emitting layer, it is preferable to form the hole-transport layer and the electron-transport layer that are in contact with the light-emitting layer 113, particularly a carrier-transport layer closer to the recombination region in the light-emitting layer 113, using the light-emitting material of the light-emitting layer or a substance having a wider band gap than the light-emitting material included in the light-emitting layer.

Next, an embodiment of a light-emitting device with a structure where a plurality of light-emitting units are stacked (also referred to as a stacked-type element or a tandem element) will be described with reference to FIG. 1C. This light-emitting device is a light-emitting device including a plurality of light-emitting units between an anode and a cathode. One light-emitting unit has substantially the same structure as that of the EL layer 103, which is illustrated in FIG. 1B. In other words, the light-emitting device illustrated in FIG. 1C can be called a light-emitting device including a plurality of light-emitting units, and the light-emitting device illustrated in FIG. 1B can be called a light-emitting device including one light-emitting unit.

In FIG. 1C, a first light-emitting unit 511 and a second light-emitting unit 512 are stacked between an anode 501 and a cathode 502, and a charge-generation layer 513 is provided between the first light-emitting unit 511 and the second light-emitting unit 512. The anode 501 and the cathode 502 correspond, respectively, to the anode 101 and the cathode 102 in FIG. 1B, and the same substance as what is given in the description for FIG. 1B can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when a voltage is applied to the anode 501 and the cathode 502. That is, in FIG. 1C, any layer can be used as the charge-generation layer 513 as long as the layer injects electrons into the first light-emitting unit 511 and injects holes into the second light-emitting unit 512 in the case where a voltage is applied such that the potential of the anode is higher than the potential of the cathode.

The charge-generation layer 513 is preferably formed with a structure similar to that of the charge-generation layer described with reference to FIG. 1B. A composite material of an organic compound and a metal oxide has an excellent carrier-injection property and an excellent carrier-transport property; thus, low-voltage driving and low-current driving can be achieved. Note that in the case where the anode-side surface of a light-emitting unit is in contact with the charge-generation layer 513, the charge-generation layer 513 can also serve as a hole-injection layer of the light-emitting unit; therefore, a hole-injection layer is not necessarily provided in the light-emitting unit.

In the case where the electron-injection buffer layer is provided in the charge-generation layer 513, the electron-injection buffer layer serves as an electron-injection layer in the light-emitting unit on the anode side; therefore, an electron-injection layer is not necessarily formed in the light-emitting unit on the anode side.

The light-emitting device having two light-emitting units is described with reference to FIG. 1C; however, the same can also be applied to a light-emitting device in which three or more light-emitting units are stacked. With a plurality of light-emitting units partitioned by the charge-generation layer 513 between a pair of electrodes as in the light-emitting device according to this embodiment, it is possible to provide a long-life element that can emit light with high luminance at a low current density. Moreover, a light-emitting apparatus that can be driven at a low voltage and has low power consumption can be achieved.

Furthermore, when emission colors of the light-emitting units are different, light emission of a desired color can be obtained from the light-emitting device as a whole. For example, in a light-emitting device having two light-emitting units, near-infrared light is obtained in the first light-emitting unit and blue light is obtained in the second light-emitting unit, whereby a light-emitting device that emits light for displaying and light for sensing at the same time can be obtained.

The above-described layers and electrodes such as the EL layer 103, the first light-emitting unit 511, the second light-emitting unit 512, and the charge-generation layer can be formed by a method such as an evaporation method (including a vacuum evaporation method), a droplet discharge method (also referred to as an ink-jet method), a coating method, or a gravure printing method. Those may include a low molecular material, a middle molecular material (including an oligomer and a dendrimer), or a high molecular material.

Embodiment 2

In this embodiment, a light-emitting apparatus using the light-emitting device described in Embodiment 1 will be described.

In this embodiment, a light-emitting apparatus fabricated using the light-emitting device described in Embodiment 1 will be described with reference to FIG. 2. Note that FIG. 2A is a top view illustrating the light-emitting apparatus, and FIG. 2B is a cross-sectional view taken along A-B and C-D in FIG. 2A. This light-emitting apparatus includes a driver circuit portion (source line driver circuit) 601, a pixel portion 602, and a driver circuit portion (gate line driver circuit) 603, which are for controlling light emission of a light-emitting device and are illustrated with dotted lines. Furthermore, 604 denotes a sealing substrate, 605 denotes a sealant, and the inside surrounded by the sealant 605 is a space 607.

Note that a lead wiring 608 is a wiring for transmitting signals to be input to the source line driver circuit 601 and the gate line driver circuit 603 and receiving a video signal, a clock signal, a start signal, a reset signal, and the like from an FPC (flexible printed circuit) 609 serving as an external input terminal. Although only the FPC is illustrated here, a printed wiring board (PWB) may be attached to this FPC. The light-emitting apparatus in this specification includes not only the light-emitting apparatus itself but also the apparatus provided with the FPC or the PWB.

Next, a cross-sectional structure will be described with reference to FIG. 2B. The driver circuit portion and the pixel portion are formed over an element substrate 610. Here, the source line driver circuit 601, which is the driver circuit portion, and one pixel of the pixel portion 602 are illustrated.

The element substrate 610 may be fabricated using a substrate containing glass, quartz, an organic resin, a metal, an alloy, a semiconductor, or the like, or a plastic substrate formed of FRP (Fiber Reinforced Plastic), PVF (polyvinyl fluoride), polyester, an acrylic resin, or the like.

There is no particular limitation on the structure of transistors used in pixels and driver circuits. For example, an inverted staggered transistor or a staggered transistor may be used. Furthermore, top-gate transistors or bottom-gate transistors may be used. There is no particular limitation on a semiconductor material used for the transistors, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and any of an amorphous semiconductor or a semiconductor having crystallinity (a microcrystalline semiconductor, a polycrystalline semiconductor, a single-crystal semiconductor, and a semiconductor partly including crystal regions) may be used. A semiconductor having crystallinity is preferably used, in which case deterioration of the transistor characteristics can be suppressed.

Here, an oxide semiconductor is preferably used for semiconductor devices such as the transistors provided in the pixels and driver circuits and transistors used for touch sensors, and the like. In particular, an oxide semiconductor having a wider band gap than silicon is preferably used. The use of an oxide semiconductor having a wider band gap than silicon can reduce the off-state current of the transistors.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such a material for the semiconductor layer makes it possible to achieve a highly reliable transistor in which a change in the electrical characteristics is reduced.

Charge accumulated in a capacitor through a transistor including the above-described semiconductor layer can be retained for a long time because of the low off-state current of the transistor. The use of such a transistor in pixels allows a driver circuit to stop while the gray level of an image displayed on each display region is maintained. As a result, an electronic device with significantly reduced power consumption can be achieved.

For stable characteristics of the transistor or the like, a base film is preferably provided. The base film can be formed to be a single-layer or a stacked-layer using an inorganic insulating film such as a silicon oxide film, a silicon nitride film, a silicon oxynitride film, or a silicon nitride oxide film. The base film can be formed by a sputtering method, a CVD (Chemical Vapor Deposition) method (e.g., a plasma CVD method, a thermal CVD method, or an MOCVD (Metal Organic CVD) method), an ALD (Atomic Layer Deposition) method, a coating method, a printing method, or the like. Note that the base film is not necessarily provided when not needed.

Note that an FET 623 is illustrated as a transistor formed in the driver circuit portion 601. The driver circuit can be formed using various circuits such as a CMOS circuit, a PMOS circuit, and an NMOS circuit. Although a driver-integrated type in which the driver circuit is formed over the substrate is described in this embodiment, the driver circuit is not necessarily formed over the substrate and can be formed outside.

The pixel portion 602 is formed with a plurality of pixels including a switching FET 611, a current control FET 612, and a first electrode 613 electrically connected to a drain of the current control FET 612; however, without being limited thereto, a pixel portion in which three or more FETs and a capacitor are combined may be employed.

Note that an insulator 614 is formed to cover an end portion of the first electrode 613. The insulator 614 can be formed using a positive photosensitive acrylic resin film here.

In order to improve the coverage with an EL layer or the like to be formed later, the insulator 614 is formed so as to have a curved surface with curvature at its upper end portion or lower end portion. For example, in the case where a positive photosensitive acrylic resin is used as a material for the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material with a high work function is desirably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stacked layer of titanium nitride film and a film containing aluminum as its main component, a three-layer structure of a titanium nitride film, a film containing aluminum as its main component, and a titanium nitride film, or the like can be used. Note that the stacked-layer structure achieves low wiring resistance, a favorable ohmic contact, and a function as an anode.

The EL layer 616 is formed by any of a variety of methods such as an evaporation method using an evaporation mask, an inkjet method, and a spin coating method. The EL layer 616 has the structure described in Embodiment 1. Alternatively, a material included in the EL layer 616 may be a low molecular compound or a high molecular compound (including an oligomer or a dendrimer).

As a material used for the second electrode 617, which is formed over the EL layer 616 and functions as a cathode, a material with a low work function (e.g., Al, Mg, Li, Ca, or an alloy or a compound thereof (e.g., MgAg, MgIn, or AlLi)) is preferably used. Note that in the case where light generated in the EL layer 616 passes through the second electrode 617, it is preferable to use, for the second electrode 617, a stacked layer of a thin metal film and a transparent conductive film (e.g., ITO, indium oxide containing zinc oxide at 2 wt % to 20 wt %, indium tin oxide containing silicon, or zinc oxide (ZnO)).

Note that a light-emitting device is formed with the first electrode 613, the EL layer 616, and the second electrode 617. The light-emitting device is the light-emitting device described in Embodiment 1. A plurality of light-emitting devices are formed in the pixel portion, and the light-emitting apparatus of this embodiment may include both the light-emitting device described in Embodiment 1 and a light-emitting device having a different structure.

The sealing substrate 604 and the element substrate 610 are attached to each other using the sealant 605, so that a structure is employed in which a light-emitting device 618 is provided in the space 607 surrounded by the element substrate 610, the sealing substrate 604, and the sealant 605. The space 607 is filled with a filler; it is filled with an inert gas (e.g., nitrogen or argon) in some cases, and filled with the sealant in some cases. The structure of the sealing substrate in which a recessed portion is formed and a desiccant is provided is preferable because deterioration due to the influence of moisture can be inhibited.

Note that an epoxy-based resin or glass frit is preferably used for the sealant 605. Furthermore, these materials are preferably materials that transmit moisture or oxygen as little as possible. As the material used for the sealing substrate 604, in addition to a glass substrate and a quartz substrate, a plastic substrate formed of FRP (Fiber Reinforced Plastics), PVF (polyvinyl fluoride), polyester, an acrylic resin, or the like can be used.

Although not illustrated in FIG. 2, a protective film may be provided over the second electrode. The protective film may be formed using an organic resin film or an inorganic insulating film. The protective film may be formed so as to cover an exposed portion of the sealant 605. The protective film may be provided so as to cover surfaces and side surfaces of the pair of substrates and exposed side surfaces of a sealing layer, an insulating layer, and the like.

For the protective film, a material that is less likely to transmit an impurity such as water can be used. Thus, diffusion of an impurity such as water from the outside into the inside can be effectively inhibited.

As a material included in the protective film, an oxide, a nitride, a fluoride, a sulfide, a ternary compound, a metal, a polymer, or the like can be used; for example, it is possible to use a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like; a material containing aluminum nitride, hafnium nitride, silicon nitride, tantalum nitride, titanium nitride, niobium nitride, molybdenum nitride, zirconium nitride, gallium nitride, or the like; or a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method that enables favorable step coverage. One such method is an atomic layer deposition (ALD) method. A material that can be formed by an ALD method is preferably used for the protective film. With the use of an ALD method, a dense protective film with reduced defects such as cracks and pinholes or with a uniform thickness can be formed. Furthermore, damage caused to a process member in forming the protective film can be reduced.

By an ALD method, a uniform protective film with few defects can be formed even on a surface with a complex uneven shape or upper, side, and lower surfaces of a touch panel.

As described above, the light-emitting apparatus fabricated using the light-emitting device described in Embodiment 1 can be obtained.

For the light-emitting apparatus in this embodiment, the light-emitting device described in Embodiment 1 is used and thus a light-emitting apparatus having favorable characteristics can be obtained. Specifically, since the light-emitting device described in Embodiment 1 has high emission efficiency, the light-emitting apparatus with low power consumption can be obtained.

Figure 3A:
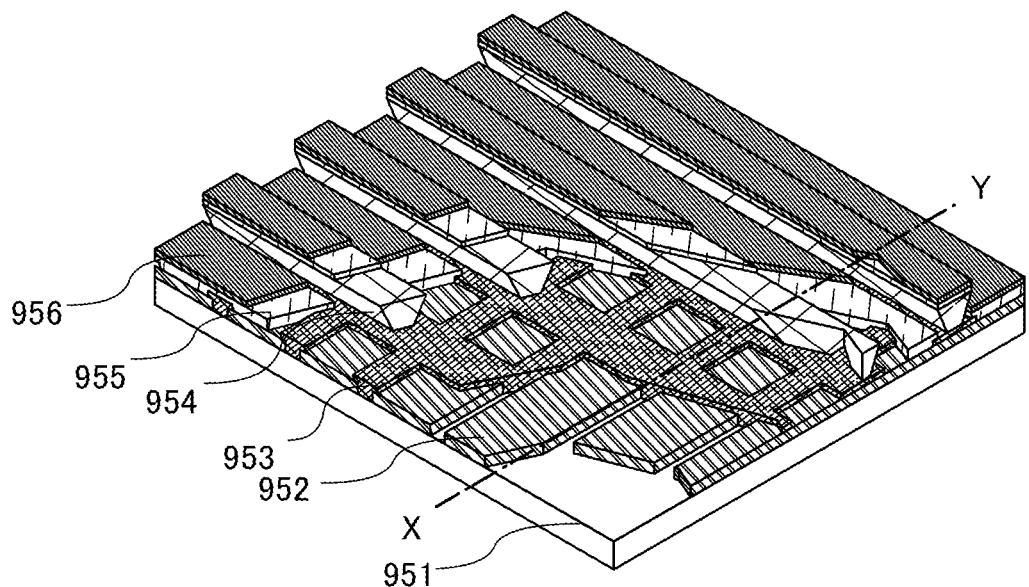
FIG. 3A and FIG. 3B are conceptual diagrams of a passive matrix light-emitting apparatus.
Figure 3B:
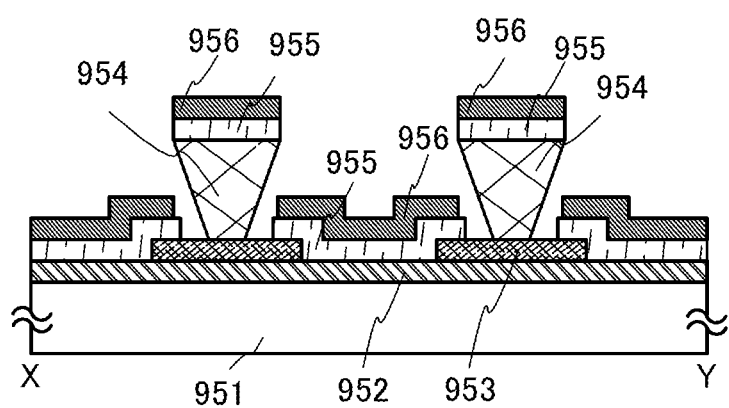

The active matrix light-emitting apparatus is described above, whereas a passive matrix light-emitting apparatus is described below. FIG. 3 illustrates a passive matrix light-emitting apparatus fabricated using the present invention. Note that FIG. 3A is a perspective view illustrating the light-emitting apparatus, and FIG. 3B is a cross-sectional view taken along X-Y in FIG. 3A. In FIG. 3, over a substrate 951, an EL layer 955 is provided between an electrode 952 and an electrode 956. An end portion of the electrode 952 is covered with an insulating layer 953. A partition layer 954 is provided over the insulating layer 953. Sidewalls of the partition layer 954 are aslope such that the distance between one sidewall and the other sidewall is gradually narrowed toward the surface of the substrate. That is, a cross section in the short side direction of the partition layer 954 is a trapezoidal shape, and the lower side (the side facing the same direction as the plane direction of the insulating layer 953 and touching the insulating layer 953) is shorter than the upper side (the side facing the same direction as the plane direction of the insulating layer 953, and not touching the insulating layer 953). By providing the partition layer 954 in this manner, defects of the light-emitting device due to static charge or the like can be prevented. The passive-matrix light-emitting apparatus also uses the light-emitting device described in Embodiment 1; thus, the light-emitting apparatus can have low power consumption or favorable reliability.

This embodiment can be freely combined with any of the other embodiments.

Embodiment 3

Figure 4A:
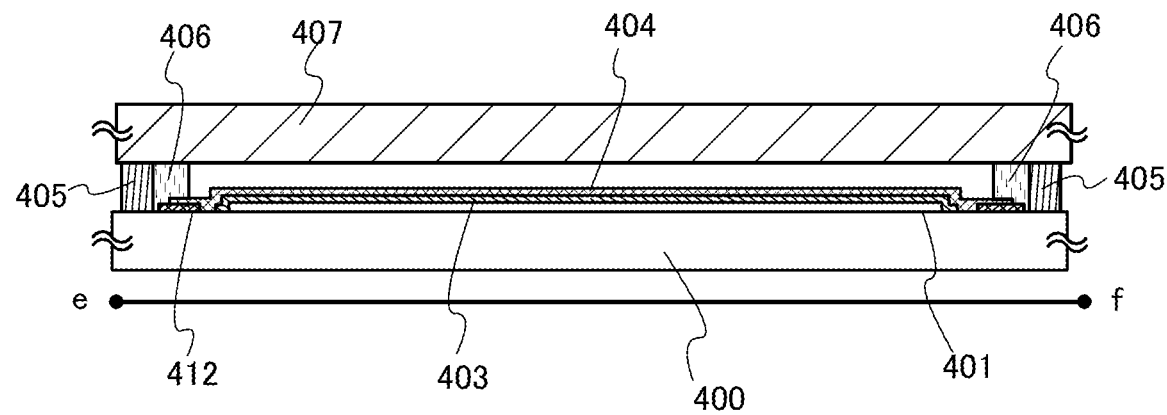
FIG. 4A and FIG. 4B are diagrams illustrating a lighting device.
Figure 4B:
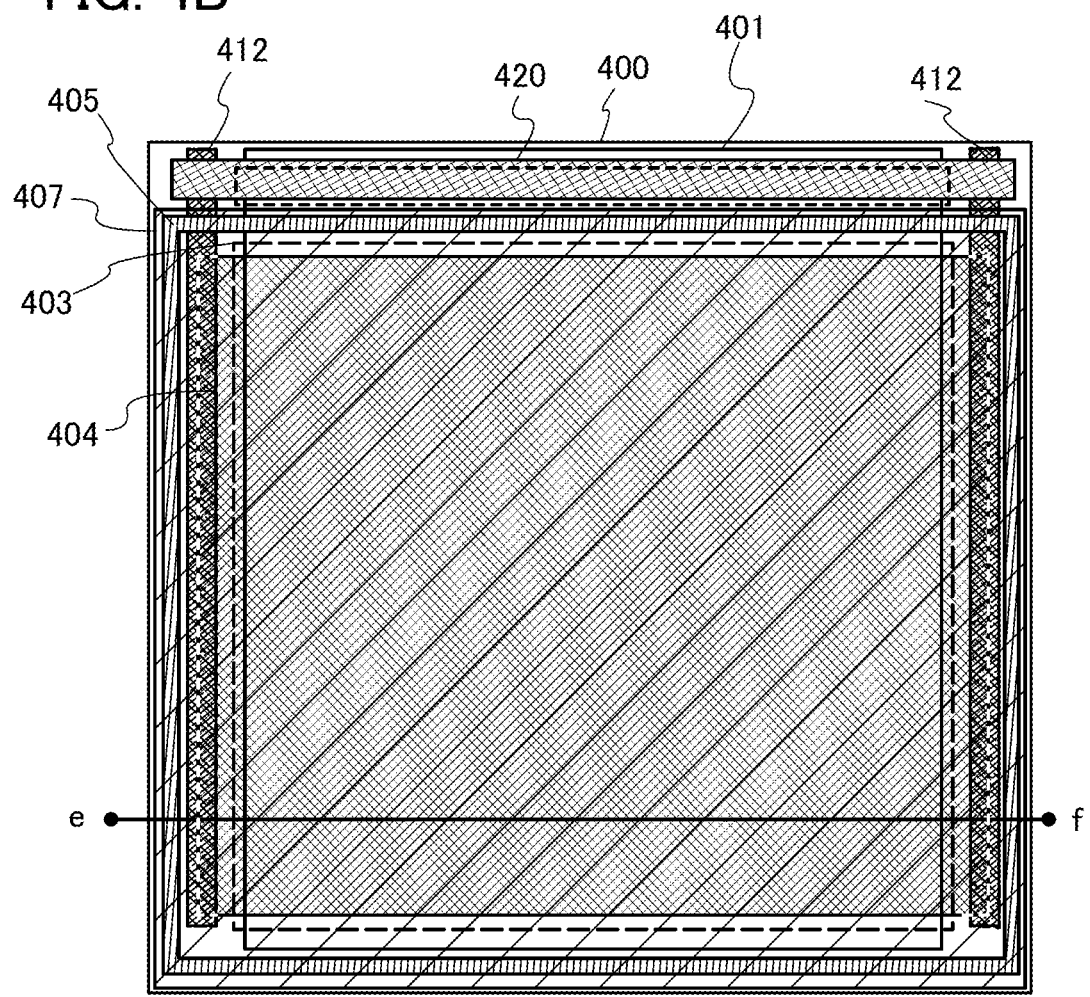

In this embodiment, an example in which the light-emitting device described in Embodiment 1 is used for a lighting device will be described with reference to FIG. 4. FIG. 4B is a top view of the lighting device, and FIG. 4A is a cross-sectional view taken along the line e-f in FIG. 4B.

In the lighting device in this embodiment, an anode 401 is formed over a substrate 400 which is a support and has a light-transmitting property. The anode 401 corresponds to the anode 101 in Embodiment 1. When light is extracted through the anode 401 side, the anode 401 is formed of a material having a light-transmitting property.

A pad 412 for applying voltage to a cathode 404 is provided over the substrate 400.

An EL layer 403 is formed over the anode 401. The EL layer 403 has a structure corresponding to that of the EL layer 103 in Embodiment 1, or the structure in which the light-emitting units 511 and 512 are combined with the charge-generation layer 513. Note that for these structures, the corresponding description can be referred to.

The cathode 404 is formed to cover the EL layer 403. The cathode 404 corresponds to the cathode 102 in Embodiment 1. The cathode 404 is formed of a material having high reflectance when light is extracted through the anode 401 side. The cathode 404 is connected to the pad 412, whereby voltage is applied.

As described above, the lighting device described in this embodiment includes a light-emitting device including the anode 401, the EL layer 403, and the cathode 404. Since the light-emitting device is a light-emitting device with high emission efficiency, the lighting device in this embodiment can be a lighting device with low power consumption.

The substrate 400 over which the light-emitting device having the above structure is formed is fixed to a sealing substrate 407 with sealants 405 and 406 and sealing is performed, whereby the lighting device is completed. It is possible to use only either the sealant 405 or 406. The inner sealant 406 (not illustrated in FIG. 4B) can be mixed with a desiccant, which enables moisture to be adsorbed, resulting in improved reliability.

When parts of the pad 412 and the anode 401 are extended to the outside of the sealants 405 and 406, those can serve as external input terminals. An IC chip 420 or the like mounted with a converter or the like may be provided over the external input terminals.

The lighting device described in this embodiment uses the light-emitting device described in Embodiment 1 as an EL element; thus, the lighting device can have low power consumption.

Embodiment 4

Figure 7:
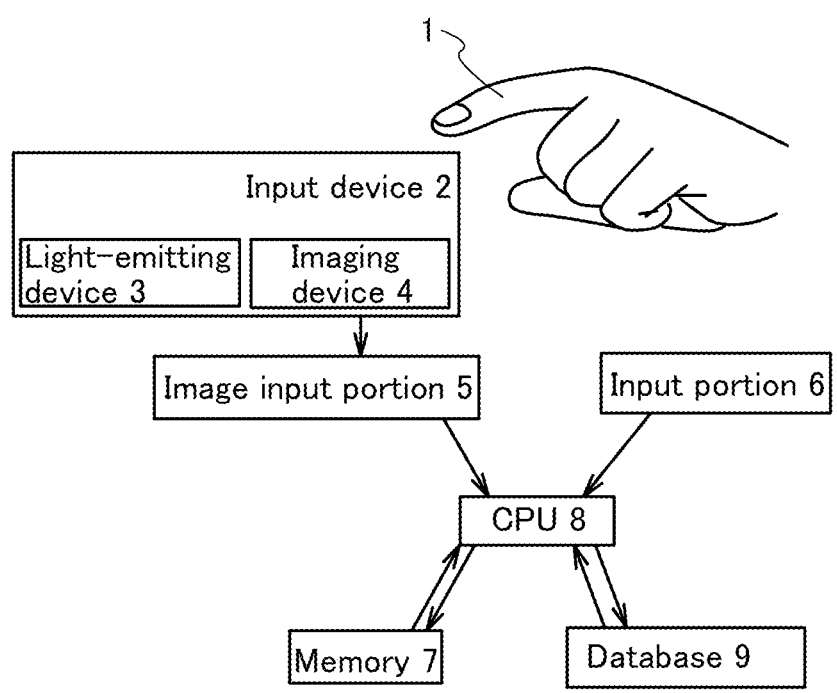
FIG. 7 is an example of a block diagram of an authentication system.

In this embodiment, an example of a vein authentication system using the light-emitting device of one embodiment of the present invention are described with reference to FIG. 7.

First, an example of the authentication processing of this authentication system is described. To begin with, a user to be authenticated inputs information identifying the user (e.g., a user's number) to an input portion 6. Next, the user presents a finger 1 to the input device 2. A light-emitting device 3 that is a light source is provided in the input device 2, and the finger 1 is irradiated with infrared light. The light-emitting device of one embodiment of the present invention can be used as the light-emitting device 3.

An imaging device 4 provided in the input device 2 inputs an image obtained by imaging to a CPU 8 through an image input portion 5. The CPU 8 stores the input image in a memory 7 and extracts feature data from the image stored in the memory 7.

Next, the CPU 8 obtains data for authentication of an individual that is stored in a database 9 on the basis of the information input in advance. Then, the CPU 8 stores the obtained data for authentication in the memory 7, performs comparison with the extracted feature data, and identifies the person who presents the finger 1 to the input device 2. As described above, the authentication system of this embodiment can perform user authentication.

Figure 8:
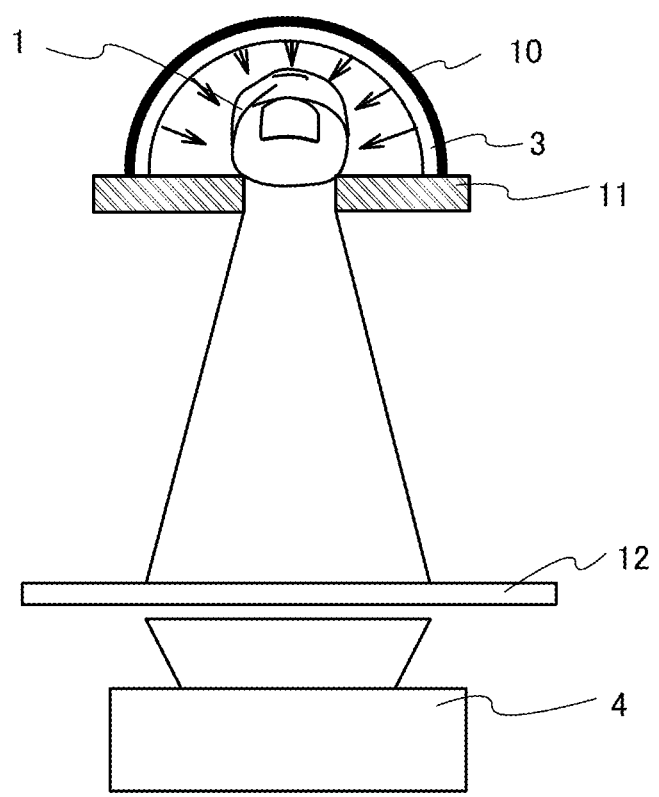
FIG. 8 is an example of a diagram of a transmissive vein authentication system.

FIG. 8 is a diagram illustrating a portion corresponding to an input device of a transmissive vein authentication device. The user's finger 1 is preferably presented so as to cover a groove formed in a guide 11. For example, a CMOS camera can be used for the imaging device 4, and when a near-infrared ray transmitting filter 12 is used in front of the imaging device 4, a clearer image can be obtained without the influence of visible light or the like. A cover 10 serves to block external light and support the light-emitting device 3, and thus is formed using a material that transmits neither visible light nor infrared light. Similarly, the guide 11 is formed using a material that transmits neither visible light nor infrared light.

In the light-emitting device of one embodiment of the present invention, a light-emitting region can be formed in a planar state, and the light-emitting device can have flexibility; therefore, a compact light source portion can be formed even in a transmissive vein authentication device. Furthermore, the power consumption can be reduced due to the favorable emission efficiency.

Figure 9:
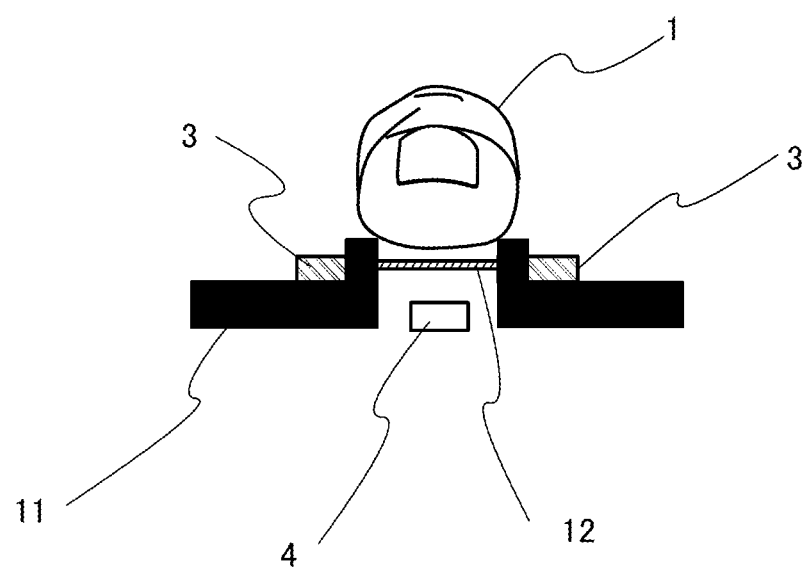
FIG. 9 is an example of a diagram of a reflective vein authentication system.

FIG. 9 is a diagram illustrating a reflective vein authentication device. The reflective vein authentication device is excellent in a reduction in size and is applied to a mobile device such as a smartphone or a smartwatch. In general, some near-infrared emission LEDs that are vertically arranged are used for a light source; however, when the light-emitting device of one embodiment of the present invention is used as the light-emitting device 3, near-infrared light with no unevenness can be irradiated and authentication accuracy can be improved. Furthermore, the light-emitting device of one embodiment of the present invention can be formed extremely thin, so that a further reduction in size can be achieved. In addition, the power consumption can be reduced due to the favorable emission efficiency, leading to suitable application to a mobile device.

Note that the light-emitting device of one embodiment of the present invention can be applied not only to a vein authentication system but also various devices or systems using near-infrared light, such as a sugar content sensor, cerebral blood flow measurement, pulse measurement, electrocardiogram measurement, and measurement of oxygen level in the bloodstream. The light-emitting device can have flexibility, can obtain a planar light-emitting region, and can be formed extremely thin, which contributes to a reduction in size and the degree of design freedom of the device. Furthermore, the power consumption can be reduced due to the favorable emission efficiency.

Embodiment 5

In this embodiment, examples of electronic devices each partly including the light-emitting device described in Embodiment 1 are described. The light-emitting device described in Embodiment 1 is a light-emitting device with high emission efficiency and low power consumption. As a result, the electronic devices described in this embodiment can be electronic devices each including a light-emitting portion with low power consumption.

Examples of electronic devices to which the light-emitting device is applied include a television devices (also referred to as TV or television receivers), monitors for computers and the like, digital cameras, digital video cameras, digital photo frames, mobile phones (also referred to as portable telephones or portable telephone devices), portable game machines, portable information terminals, smartwatches, audio playback devices, and large game machines such as pin-ball machines. Specific examples of these electronic devices are shown below.

Figure 5A:
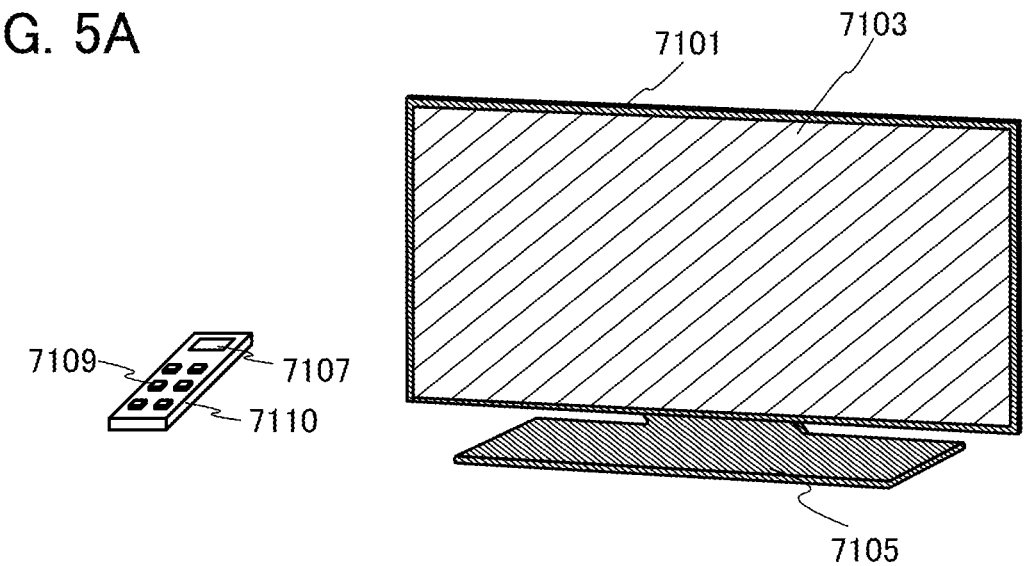
Figure 5A:
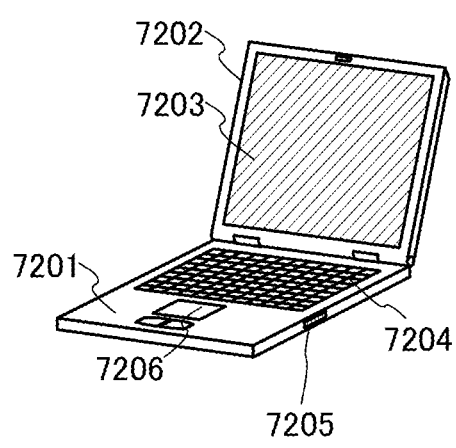
Figure 5A:
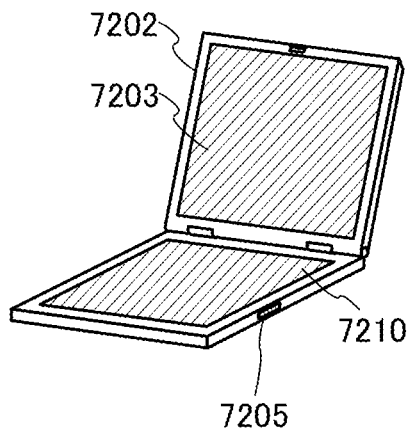

FIG. 5A illustrated an example of a television device. In the television device, a display portion 7103 is incorporated in a housing 7101. Here, a structure in which the housing 7101 is supported by a stand 7105 is illustrated. Images can be displayed on the display portion 7103, and the light-emitting devices described in Embodiment 1 are arranged in a matrix in the display portion 7103.

The television device can be operated with an operation switch of the housing 7101 or a separate remote controller 7110. With operation keys 7109 of the remote controller 7110, channels and volume can be operated and images displayed on the display portion 7103 can be operated. Furthermore, a structure may be employed in which the remote controller 7110 is provided with a display portion 7107 for displaying data output from the remote controller 7110.

Note that the television device has a structure of including a receiver, a modem, and the like. With the use of the receiver, a general television broadcast can be received, and moreover, when the television device is connected to a communication network with or without a wire via the modem, one-way (from a sender to a receiver) or two-way (between a sender and a receiver or between receivers) data communication can be performed.

FIG. 5B1 is a computer which includes a main body 7201, a housing 7202, a display portion 7203, a keyboard 7204, an external connection port 7205, a pointing device 7206, and the like. Note that this computer is fabricated using the light-emitting devices described in Embodiment 1 arranged in a matrix in the display portion 7203. The computer in FIG. 5B1 may be such a mode as illustrated in FIG. 5B2. The computer in FIG. 5B2 is provided with a second display portion 7210 instead of the keyboard 7204 and the pointing device 7206. The second display portion 7210 is of a touch-panel type, and input can be performed by operating display for input displayed on the second display portion 7210 with a finger or a dedicated pen. The second display portion 7210 can also display images other than the display for input. The display portion 7203 may also be a touch panel. Connecting the two screens with a hinge can prevent troubles such as a crack in or damage to the screens caused when the computer is stored or carried.

Figure 5C:
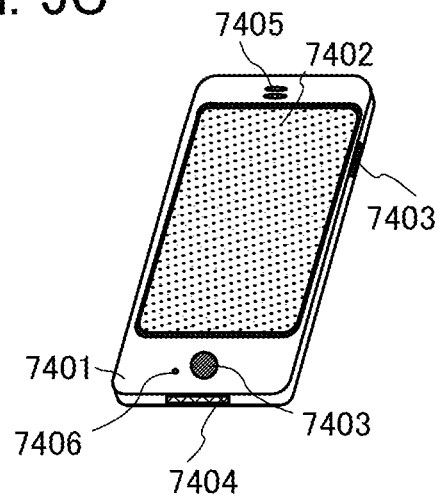

FIG. 5C illustrates an example of a portable terminal. A mobile phone includes operation buttons 7403, an external connection port 7404, a speaker 7405, a microphone 7406, and the like in addition to a display portion 7402 incorporated in a housing 7401. Note that the mobile phone may include the display portion 7402 which is fabricated by arranging the light-emitting devices described in Embodiment 1 in a matrix.

The portable terminal illustrated in FIG. 5C may have a structure in which information can be input by touching the display portion 7402 with a finger or the like. In this case, operations such as making a call and creating an e-mail can be performed by touching the display portion 7402 with a finger or the like.

The display portion 7402 has mainly three screen modes. The first one is a display mode mainly for displaying images, and the second one is an input mode mainly for inputting data such as text. The third one is a display+input mode in which two modes of the display mode and the input mode are combined.

For example, in the case of making a call or creating an e-mail, a text input mode mainly for inputting text is selected for the display portion 7402 so that an operation of inputting text displayed on the screen may be performed. In this case, it is preferable to display a keyboard or number buttons on almost the entire screen of the display portion 7402.

When a sensing device including a sensor for sensing inclination, such as a gyroscope sensor or an acceleration sensor, is provided inside the portable terminal, screen display of the display portion 7402 can be automatically changed by determining the orientation of the portable terminal (vertically or horizontally).

The screen modes are changed by touching the display portion 7402 or operating the operation buttons 7403 of the housing 7401. Alternatively, the screen modes can be changed depending on the kind of image displayed on the display portion 7402. For example, when a signal of an image displayed on the display portion is moving image data, the screen mode is changed to the display mode, and when the signal is text data, the screen mode is changed to the input mode.

Moreover, in the input mode, when input by the touch operation of the display portion 7402 is not performed for a certain period while a signal sensed by an optical sensor in the display portion 7402 is sensed, the screen mode may be controlled so as to be changed from the input mode to the display mode.

The display portion 7402 can also function as an image sensor. For example, an image of a palm print, a fingerprint, or the like is taken when the display portion 7402 is touched with the palm or the finger, whereby personal authentication can be performed. Furthermore, when the light-emitting device described in Embodiment 1 is provided in the display portion, an image of a finger vein, a palm vein, or the like can be taken.

Figure 6A:
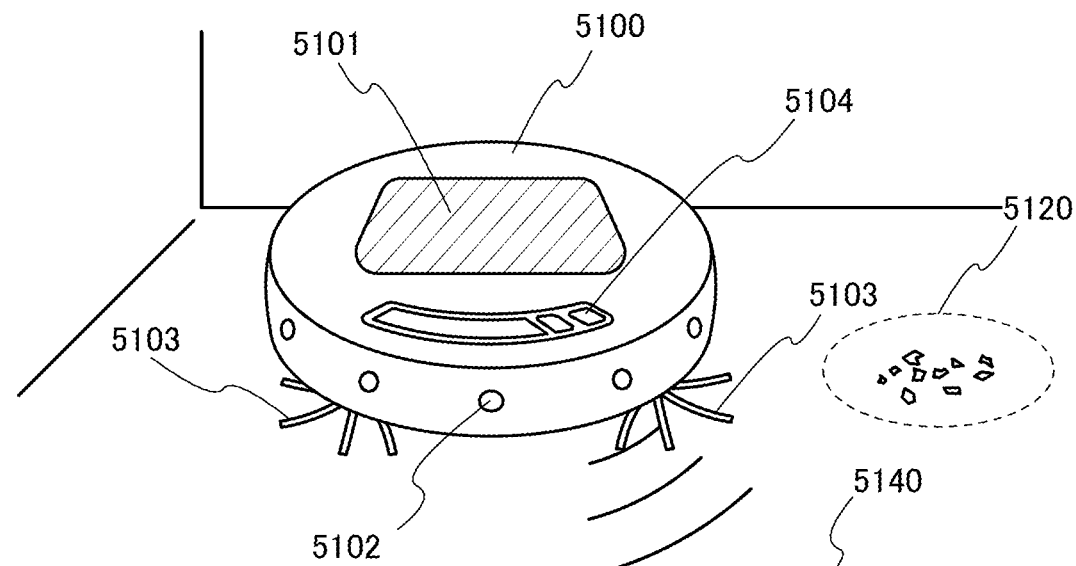
FIG. 6A, FIG. 6B, and FIG. 6C are diagrams illustrating electronic devices.

FIG. 6A is a schematic view illustrating an example of a cleaning robot.

A cleaning robot 5100 includes a display 5101 placed on its top surface, a plurality of cameras 5102 placed on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. In addition, the cleaning robot 5100 has a wireless communication means. The light-emitting device of one embodiment of the present invention may be mounted as the sensors or the communication means.

The cleaning robot 5100 is self-propelled, detects dust 5120, and sucks up the dust through the inlet provided on the bottom surface.

The cleaning robot 5100 can judge whether there is an obstacle such as a wall, furniture, or a step by analyzing images taken by the cameras 5102. When an object that is likely to be caught in the brush 5103, such as a wire, is detected by image analysis, the rotation of the brush 5103 can be stopped.

The display 5101 can display the remaining capacity of a battery, the amount of vacuumed dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor the room even from the outside. The display on the display 5101 can be checked by the portable electronic device such as a smartphone.

The light-emitting apparatus of one embodiment of the present invention may be used for the display 5101.

Figure 6B:
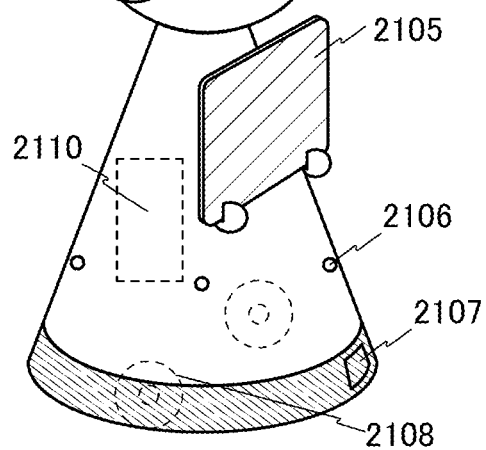

A robot 2100 illustrated in FIG. 6B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect the presence of an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the obstacle sensor 2107 or the display 2105.

Figure 6C:
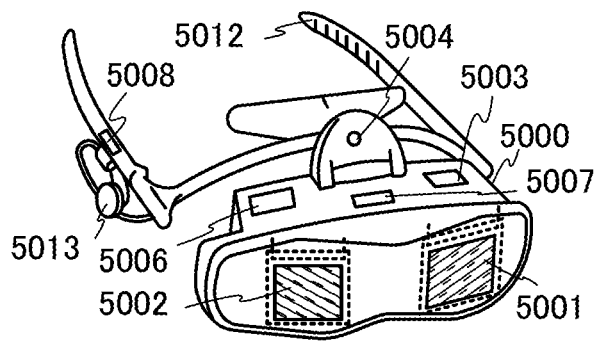

FIG. 6C illustrates an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a display portion 5002, a support 5012, and an earphone 5013.

The light-emitting apparatus of one embodiment of the present invention can be used for the sensor 5007, the display portion 5001, and the display portion 5002.

Figure 10A:
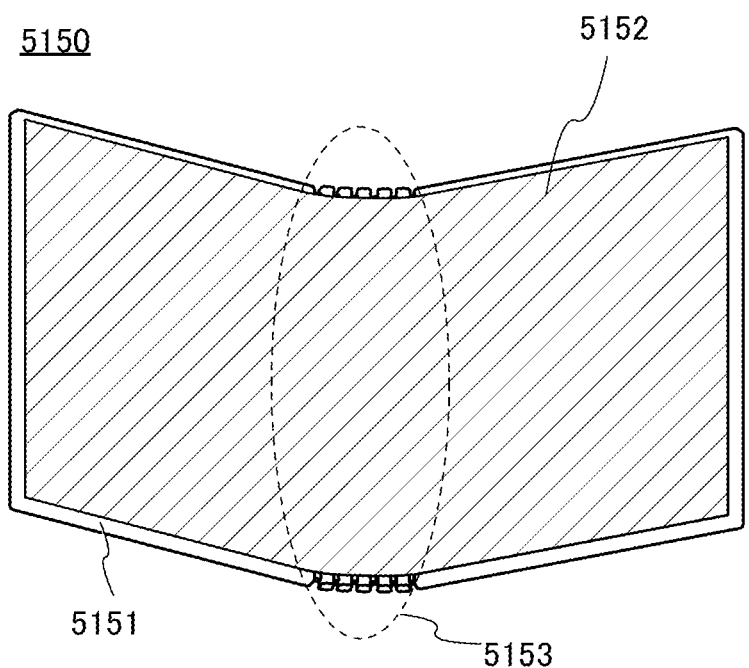
FIG. 10A and FIG. 10B are diagrams illustrating an electronic device.
Figure 10B:
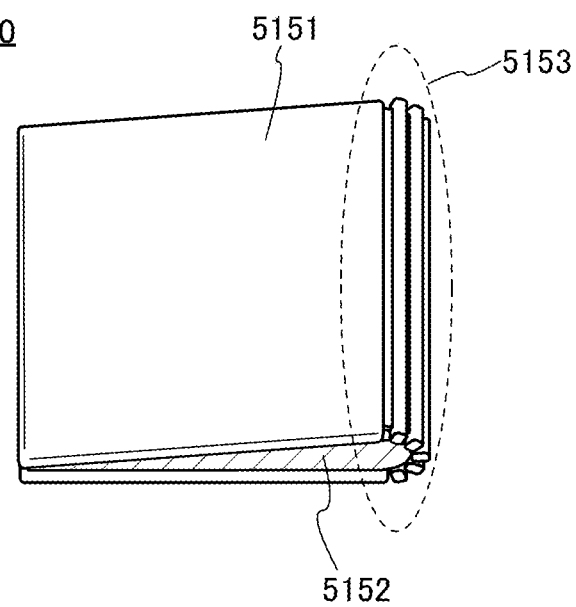

FIG. 10A and FIG. 10B illustrate a foldable portable information terminal 5150. The foldable portable information terminal 5150 includes a housing 5151, a display region 5152, and a bend portion 5153. FIG. 10A illustrates the portable information terminal 5150 that is opened. FIG. 10B illustrates the portable information terminal 5150 that is folded. The portable information terminal 5150 is compact in size and has excellent portability when folded, despite its large display region 5152.

The display region 5152 can be folded in half with the bend portion 5153. The bend portion 5153 includes a flexible member and a plurality of supporting members, and when the display region is folded, the flexible member expands and the bend portion 5153 has a radius of curvature of 2 mm or more, preferably 3 mm or more.

Note that the display region 5152 may be a touch panel (an input/output device) including a touch sensor (an input device). The light-emitting device of one embodiment of the present invention can be used for the display region 5152.

Figure 11A:
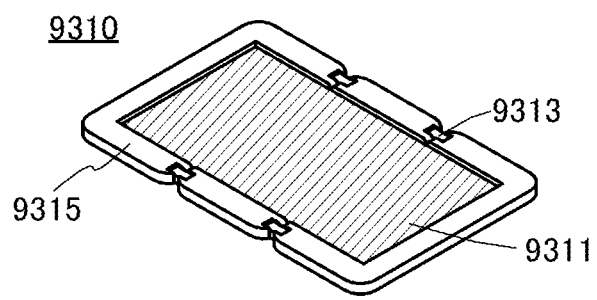
FIG. 11A, FIG. 11B, and FIG. 11C are diagrams illustrating an electronic device.
Figure 11B:
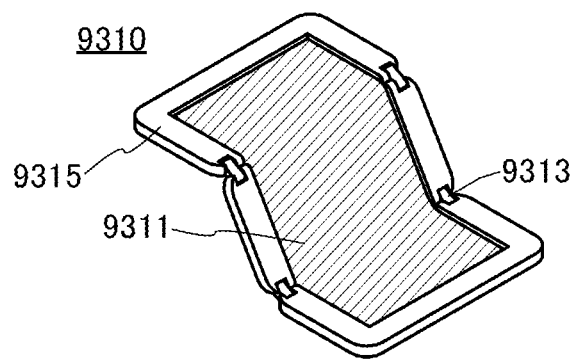
Figure 11C:
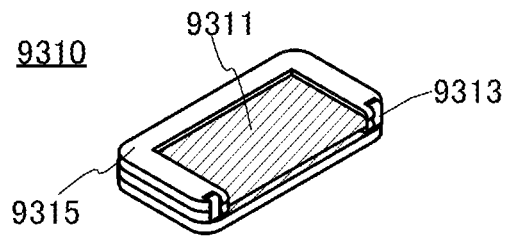
Figure 12:
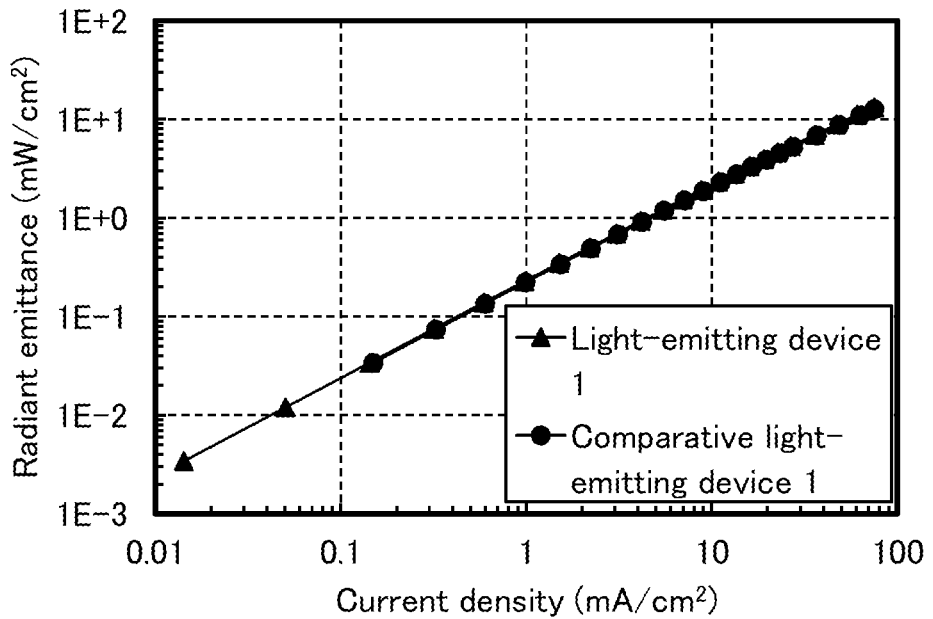
FIG. 12 shows radiant emittance-current density characteristics of a light-emitting device 1 and a comparative light-emitting device 1.
Figure 13:
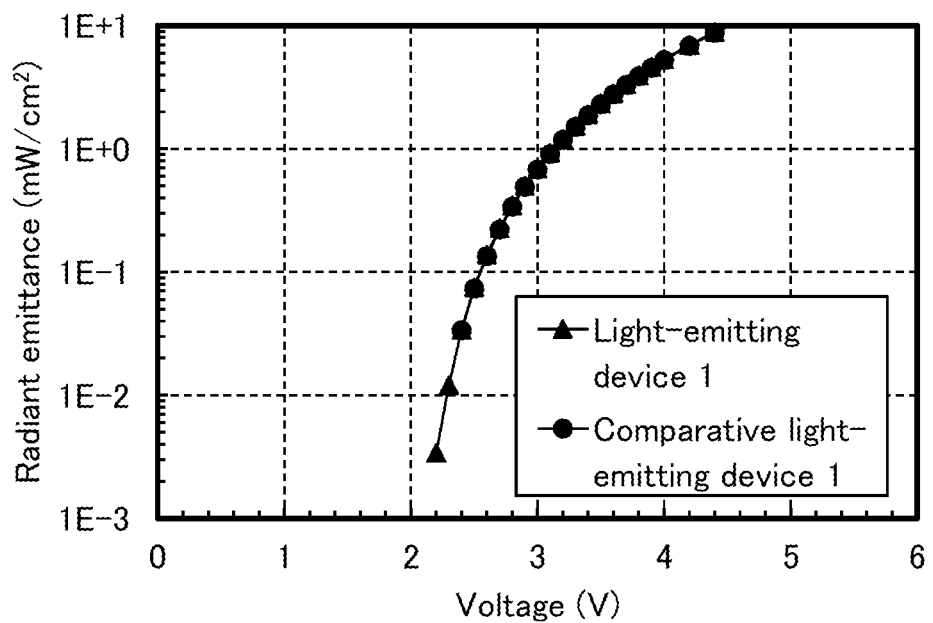
FIG. 13 shows radiant emittance-voltage characteristics of the light-emitting device 1 and the comparative light-emitting device 1.
Figure 14:
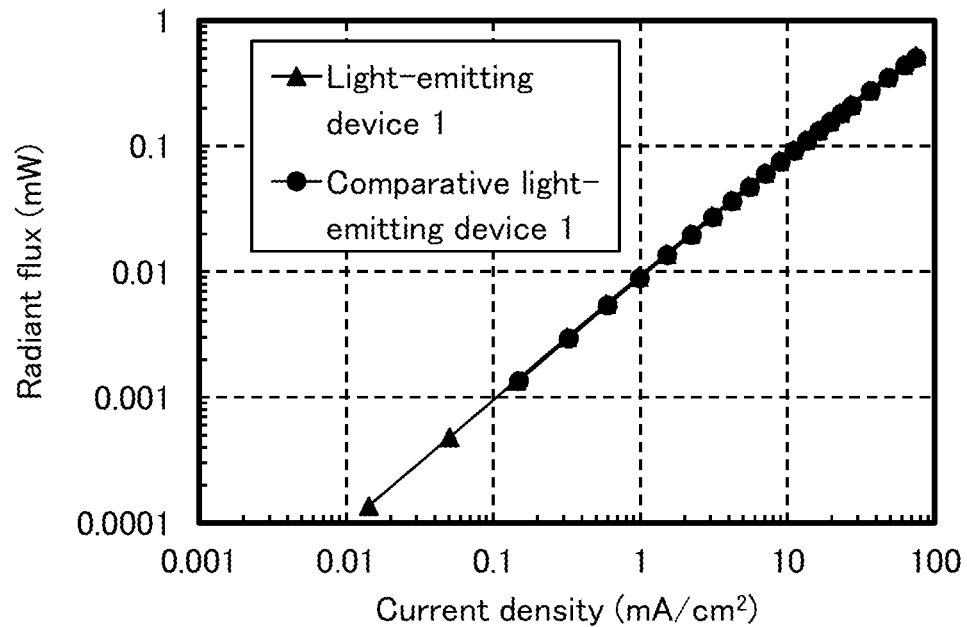
FIG. 14 shows radiant flux-current density characteristics of the light-emitting device 1 and the comparative light-emitting device 1.
Figure 15:
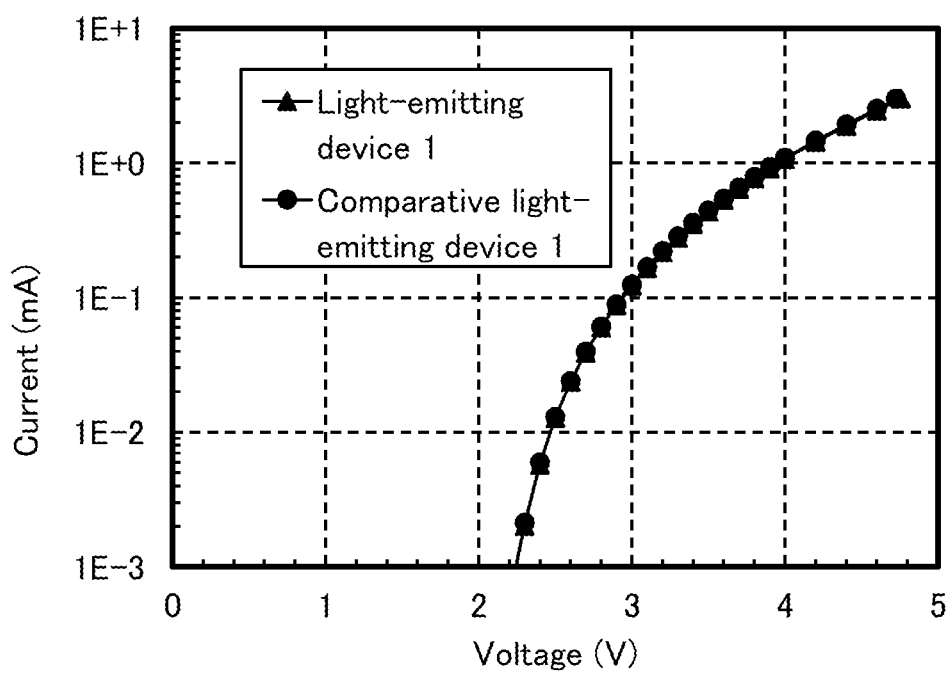
FIG. 15 shows current-voltage characteristics of the light-emitting device 1 and the comparative light-emitting device 1.
Figure 16:
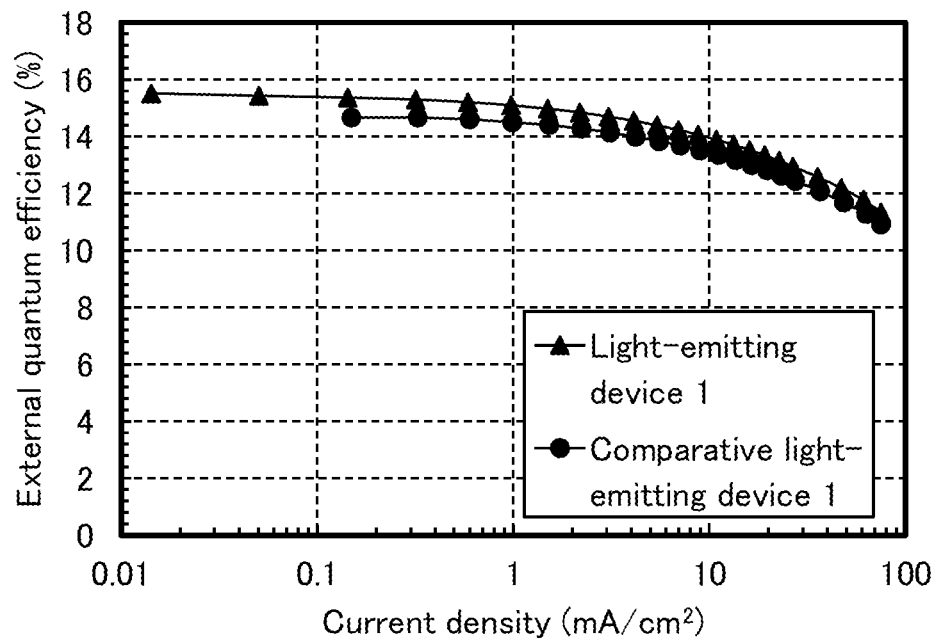
FIG. 16 shows external quantum efficiency-current density characteristics of the light-emitting device 1 and the comparative light-emitting device 1.
Figure 17:
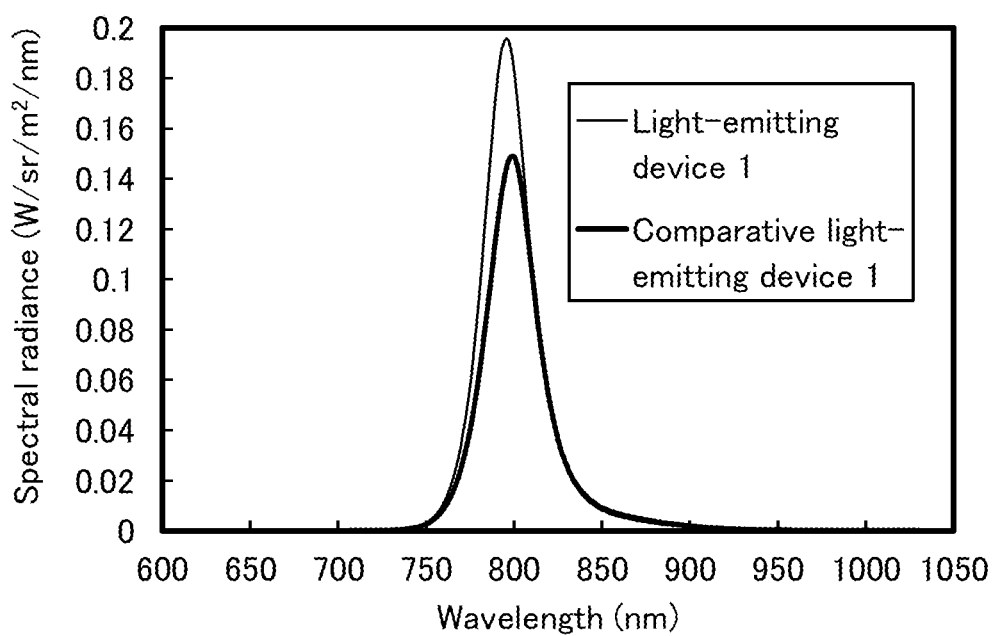
FIG. 17 shows EL emission spectra of the light-emitting device 1 and the comparative light-emitting device 1.

FIG. 11A to FIG. 11C illustrate a foldable portable information terminal 9310. FIG. 11A illustrates the portable information terminal 9310 that is opened. FIG. 11B illustrates the portable information terminal 9310 that is in the state of being changed from one of an opened state and a folded state to the other. FIG. 11C illustrates the portable information terminal 9310 that is folded. The portable information terminal 9310 is excellent in portability when folded, and is excellent in display browsability when opened because of a seamless large display region.

A display panel 9311 is supported by three housings 9315 joined together by hinges 9313. Note that the display panel 9311 may be a touch panel (an input/output device) including a sensor that uses the light-emitting device of one embodiment of the present invention (an input device, an authentication device). By folding the display panel 9311 at the hinges 9313 between two housings 9315, the portable information terminal 9310 can be reversibly changed in shape from the opened state to the folded state. The light-emitting device of one embodiment of the present invention can be used for the display panel 9311.

Note that the structures described in this embodiment can be combined with the structures described in any of Embodiment 1 to Embodiment 3 as appropriate.

As described above, the application range of the light-emitting apparatus including the light-emitting device described in Embodiment 1 is extremely wide, so that this light-emitting apparatus can be applied to electronic devices in a variety of fields. With the use of the light-emitting device described in Embodiment 1, an electronic device with low power consumption can be obtained.

Example 1

In this example, a light-emitting device 1, which is the light-emitting device of one embodiment of the present invention, and a comparative light-emitting device 1, which is a light-emitting device for comparison, are described. Structural formulae of organic compounds used for the light-emitting device 1 and the comparative light-emitting device 1 are shown below.

[Chemical Formula 6]

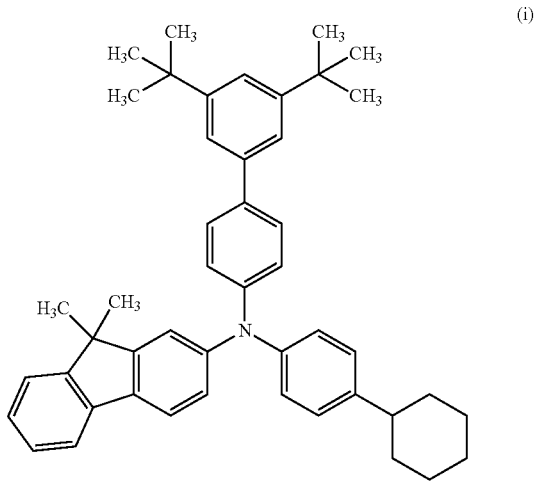

mmtBuBichPAF (i)

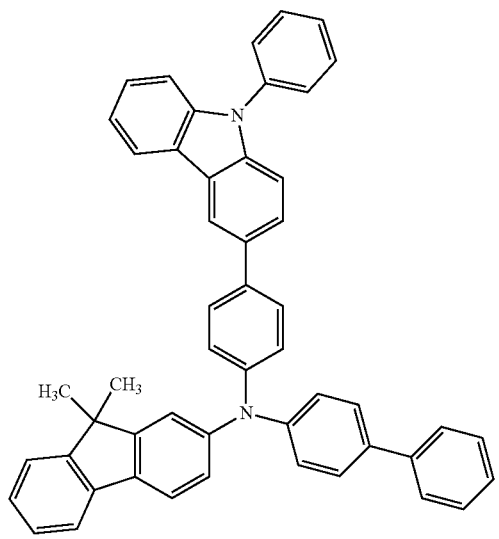

PCBBiF
(ii)

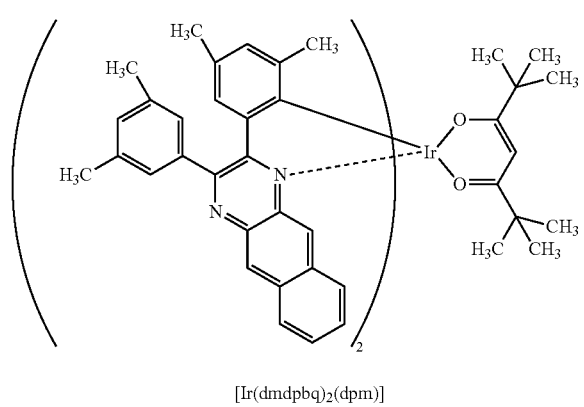

9mDBtBPNfpr
(iii)

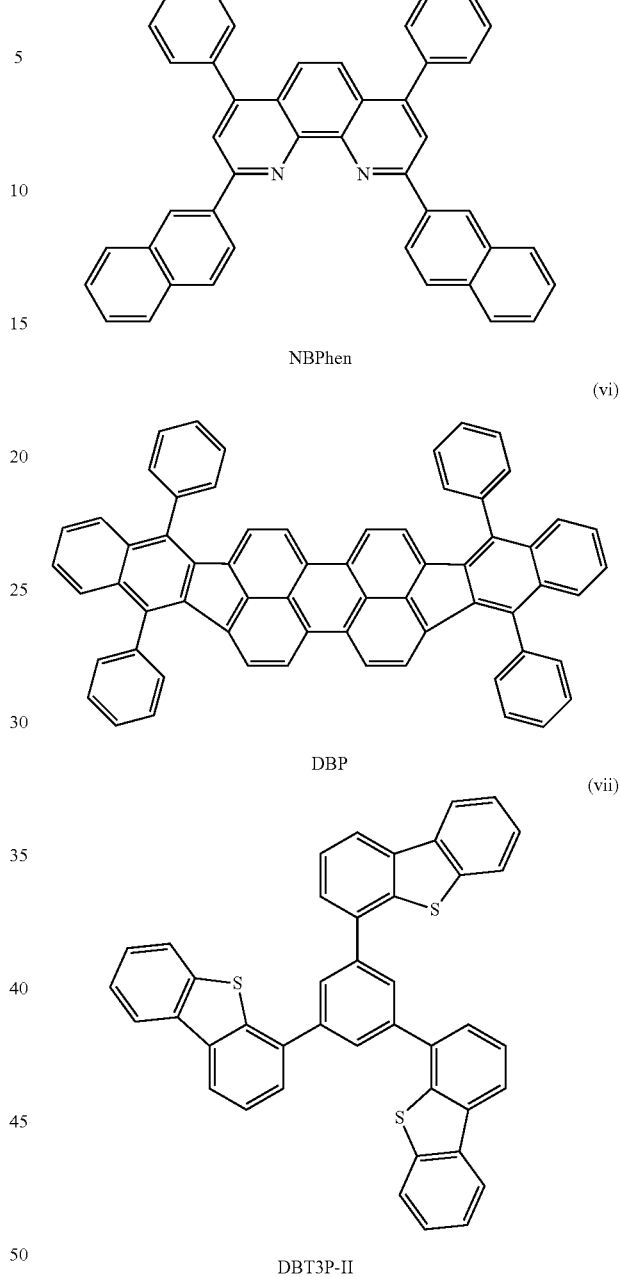

NBPhen
(v)

DBP
(vi)

DBT3P-II
(vii)

[Ir(dmdpbq)₂(dpm)]
(iv)

(Fabrication Method of Light-Emitting Device 1)

First, over a glass substrate, an alloy film of silver (Ag), palladium (Pd), and copper (Cu) (an Ag—Pd—Cu (APC) film) was formed as a reflective electrode to a thickness of 100 nm by a sputtering method, and a film of indium tin oxide containing silicon oxide (ITSO) was formed as a transparent electrode to a thickness of 10 nm by a sputtering method, so that the anode 101 was formed. Note that the area of the electrode was 4 mm² (2 mm×2 mm).

Next, in pretreatment for forming the light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to approximately $10^{-4}$ Pa, vacuum baking at 170° C. for 30 minutes was performed in a heating chamber in the vacuum evaporation apparatus, and then the substrate was cooled down for approximately 30 minutes.

Next, the substrate over which the anode 101 was formed was fixed to a substrate holder provided in the vacuum evaporation apparatus so that the surface over which the anode 101 was formed faced downward, and N-(4-cyclohexylphenyl)-N-(3",5"-ditertiarybutyl-1,1"-biphenyl-4-yl)-N-(9,9-dimethyl-9H-fluoren-2yl)amine (abbreviation: mmtBuBichPAF) represented by Structural Formula (i) above and ALD-MP001Q (produced by Analysis Atelier Corporation, material serial No. 1S20170124) were co-evaporated over the anode 101 to have a weight ratio of 1:0.1 (=mmtBuBichPAF:ALD-MP001Q) to a thickness of 10 nm by an evaporation method using resistance heating, whereby the hole-injection layer 111 was formed.

Next, over the hole-injection layer 111, as a first hole-transport layer, mmtBuBichPAF was deposited by evaporation to a thickness of 55 nm, and then, as a second hole-transport layer, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (ii) above was deposited by evaporation to a thickness of 10 nm; whereby the hole-transport layer 112 was formed. Note that the second hole-transport layer also functions as an electron-blocking layer.

Then, 9-[3'-(dibenzothiophen-4-yl)biphenyl-3-yl]naphtho[1',2':4,5]furo[2,3-b]pyrazine (abbreviation: 9mDBtBPNfpr) represented by Structural Formula (iii) above, PCBBiF, and bis{4,6-dimethyl-2-[3-(3,5-dimethylphenyl)-2-benzo[g]quinoxalinyl-κN]phenyl-κC}(2,2,6,6-tetramethyl-3,5-heptanedionato-κ$^2$O,O')iridium(III) (abbreviation: [Ir(dmdpbq)$_2$(dpm)]) represented by Structural Formula (iv) above were co-evaporated to a thickness of 10 nm to have a weight ratio of 0.7:0.3:0.025 (=9mDBtBPNfpr:PCBBiF:[Ir(dmdpbq)$_2$(dpm)]), whereby the light-emitting layer 113 was formed.

After that, over the light-emitting layer 113, as a first electron-transport layer, 9mDBtBPNfpr was deposited by evaporation to a thickness of 20 nm, and then as a second electron-transport layer, 2,9-di(2-naphthyl)-4,7-diphenyl-1,10-phenanthroline (abbreviation: NBPhen) represented by Structural Formula (v) above was deposited by evaporation to a thickness of 65 nm, whereby the electron-transport layer 114 was formed.

After the formation of the electron-transport layer 114, LiF was deposited by evaporation to a thickness of 1 nm to form the electron-injection layer 115, and silver (Ag) and magnesium (Mg) in a volume ratio of 1:0.1 were deposited by evaporation to a thickness of 30 nm, whereby the cathode 102 was formed. Lastly, 5,10,15,20-tetraphenylbisbenzo[5,6]indeno[1,2,3-cd:1',2',3'-lm]perylene (abbreviation: DBP) represented by Structural Formula (vi) above was deposited by evaporation to a thickness of 100 nm in contact with the cathode 102 to form the first layer, whereby the light-emitting device 1 was fabricated. Note that the cathode 102 is a transflective electrode having a function of reflecting light and a function of transmitting light, and the light-emitting device 1 of this example is a top-emission element from which light is extracted through the cathode 102.

(Fabrication Method of Comparative Light-Emitting Device 1)

The comparative light-emitting device 1 was fabricated in a manner similar to that of the light-emitting device 1 except that 4,4',4"-(benzene-1,3,5-triyl)tri(dibenzothiophene) (abbreviation: DBT3P-II) represented by Structural Formula (vii) was deposited by evaporation to a thickness of 115 nm as the first layer in the light-emitting device 1.

The element structures of the light-emitting device 1 and the comparative light-emitting device 1 are listed in the following table.

TABLE 1

|  | Film thickness | Light-emitting device 1 | Comparative light-emitting device 1 |
|---|---|---|---|
| First layer |  | *1 | DBP | DBT3P-II |
| Cathode |  | 30 nm | Ag:Mg (10:1) | |
| Electron-injection layer |  | 1 nm | LiF | |
| Electron-transport layer | 2 | 65 nm | NBPhen | |
|  | 1 | 20 nm | 9mDBtBPNfpr | |
| Light-emitting layer |  | 10 nm | 9mDBtBPNfpr:PCBBiF:Ir(dmdpbq)$_2$(dpm) (0.7:0.3:0.025) | |
| Hole-transport layer | 2 | 10 nm | PCBBiF | |
|  | 1 | 55 nm | mmtBuBichPAF | |
| Hole-injection layer |  | 10 nm | mmtBuBichPAF:ALD-MP001Q (1:0.1) | |
| Anode | 2 | 10 nm | ITSO | |
|  | 1 | 100 nm | APC | |

*1 Light-emitting device 1: 100 nm,
Comparative light-emitting device 1: 115 nm

These light-emitting devices were subjected to sealing with a glass substrate (a sealant was applied to surround the elements, followed by UV treatment and one-hour heat treatment at 80° C. at the time of sealing) in a glove box containing a nitrogen atmosphere so that the light-emitting devices are not exposed to the air. Then, the initial characteristics and reliability of the light-emitting device 1 and the comparative light-emitting device 1 were measured. Note that the measurement was performed at room temperature.

FIG. 12, FIG. 13, FIG. 14, FIG. 15, FIG. 16, and FIG. 17 show, of the light-emitting device 1 and the comparative light-emitting device 1, radiant emittance-current density characteristics, radiant emittance-voltage characteristics, radiant flux-current density characteristics, current-voltage characteristics, external quantum efficiency-current density characteristics, and EL emission spectra when a current flows at a current density of 10 mA/cm$^2$, respectively. Table 2 shows the main characteristics of the light-emitting device 1 and the comparative light-emitting device 1 at a current density of around 10 mA/cm$^2$. Note that radiant emittance, radiant flux, and external quantum efficiency were calculated using a near-infrared spectroradiometer (SR-NIR, manufactured by TOPCON TECHNOHOUSE CORPORATION), assuming that the light-distribution characteristics of the device were Lambertian type.

TABLE 2

|  | Voltage (V) | Current (mA) | Current density (mA/cm²) | Radiance (W/sr/m²) | Radiant flux (mW) | External quantum efficiency (%) | Energy efficiency (%) |
|---|---|---|---|---|---|---|---|
| Light-emitting device 1 | 3.5 | 0.435 | 10.9 | 7.43 | 0.0934 | 13.9 | 6.1 |
| Comparative light-emitting device 1 | 3.4 | 0.359 | 9.0 | 5.96 | 0.0749 | 13.4 | 5.9 |

It was found from FIG. 12 to FIG. 17 and Table 2 that the external quantum efficiency of the light-emitting device 1 is improved by the provision of DBP layer in contact with the cathode 102, although the light-emitting device 1 and the comparative light-emitting device 1 are near-infrared light-emitting devices having favorable characteristics.

Figure 18:
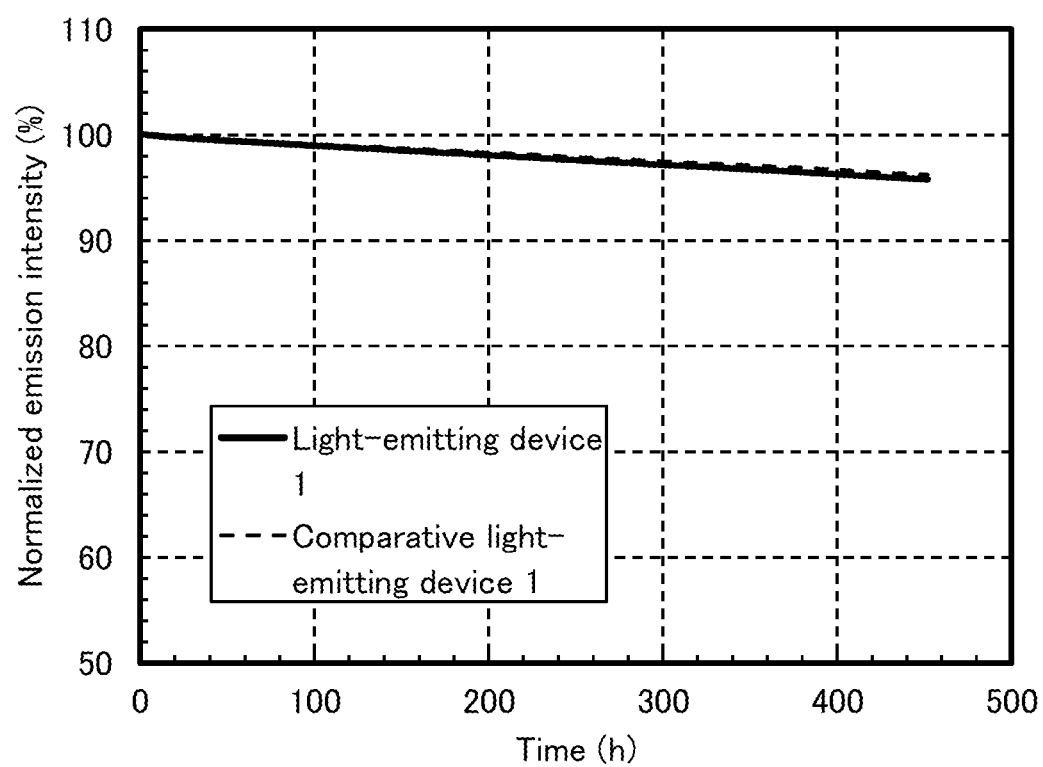
FIG. 18 is a graph showing a change in luminance over driving time of the light-emitting device 1 and the comparative light-emitting device 1.

FIG. 18 is a graph showing a change in luminance over driving time in the case where the luminance at a current density of 75 mA/cm² is normalized as the initial luminance. As shown in FIG. 18, the luminance keeps 95% or more of the initial luminance even when 450 hours have passed. This reveals that a reduction in luminance over driving time is particularly small and the light-emitting device 1 and the comparative light-emitting device 1 are light-emitting devices having extremely long lifetime.

Here, light-emitting devices 1-1 to 1-4 in which the thickness of the first layer in the light-emitting device 1 was changed and comparative light-emitting devices 1-1 to 1-4 in each of which the thickness of the first layer in the comparative light-emitting device was changed were fabricated. The thickness of the first layer in each light-emitting device is listed in Table 3.

TABLE 3

| Thickness of first layer | 100 nm | 115 nm | 130 nm | 145 nm |
|---|---|---|---|---|
| Light-emitting device | 1-1 | 1-2 | 1-3 | 1-4 |
| Comparative light-emitting device | 1-1 | 1-2 | 1-3 | 1-4 |

Figure 19:
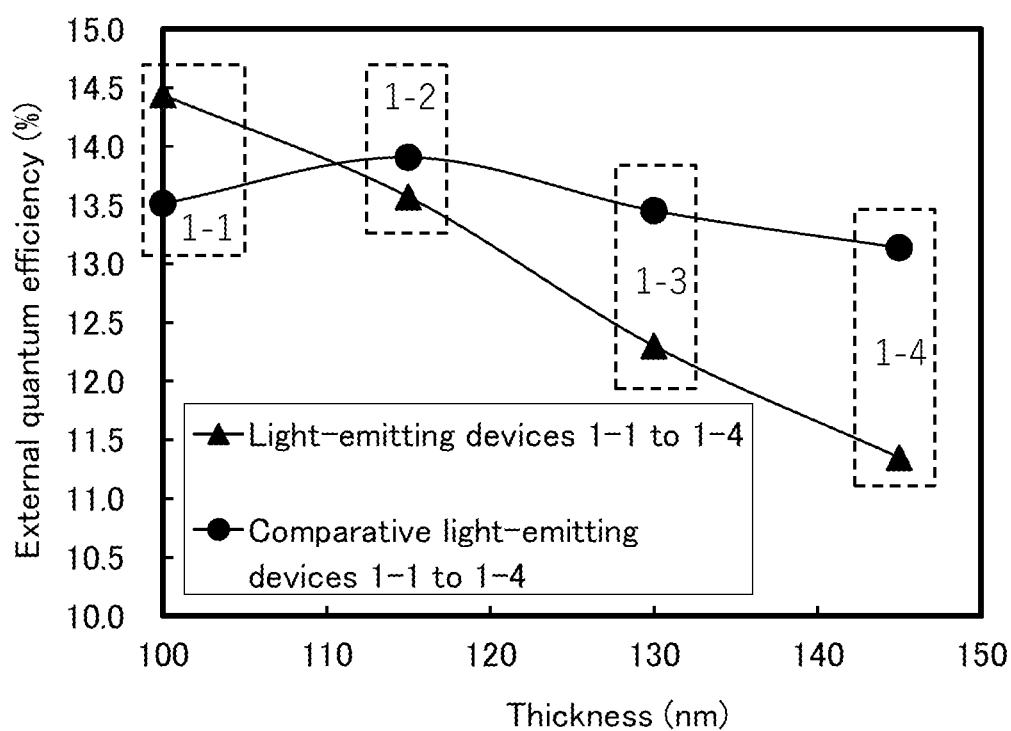
FIG. 19 is a graph showing a change in external quantum efficiency with respect to the thickness of a first layer in each of light-emitting devices 1-1 to 1-4 and comparative light-emitting devices 1-1 to 1-4.
Figure 20A:
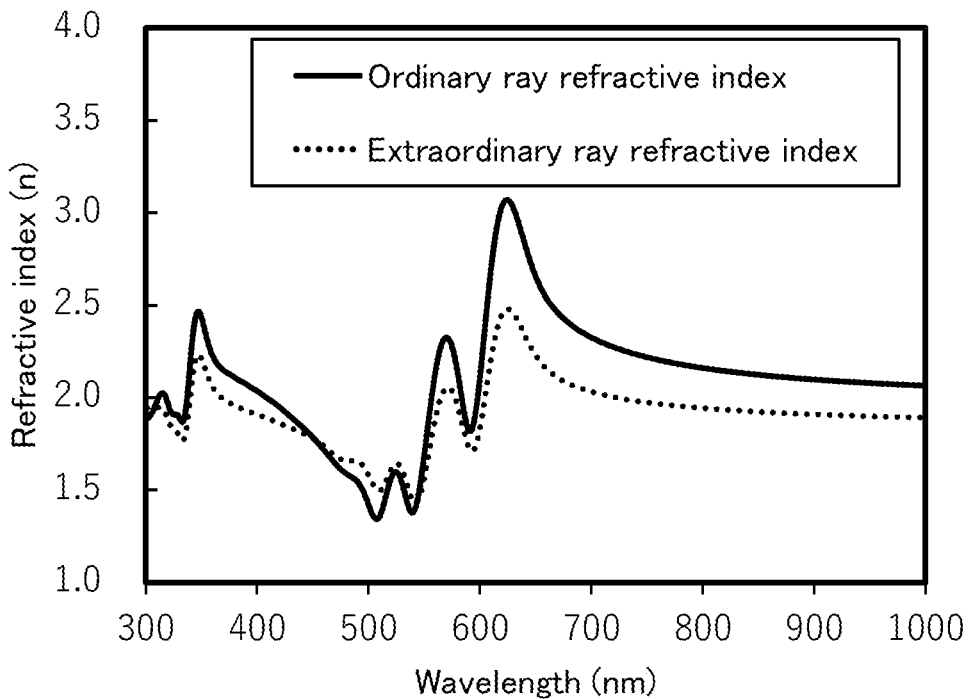
FIG. 20A is a graph showing the refractive index n of DBP.
Figure 20B:
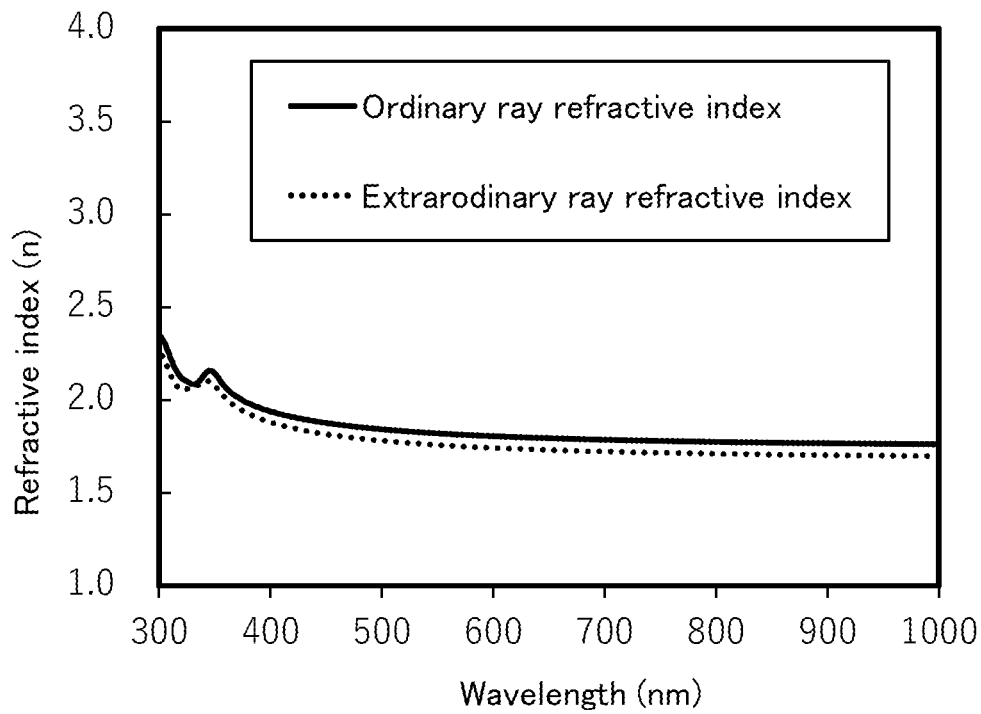
FIG. 20B is a graph showing the refractive index n of DBT3P-II.
Figure 21A:
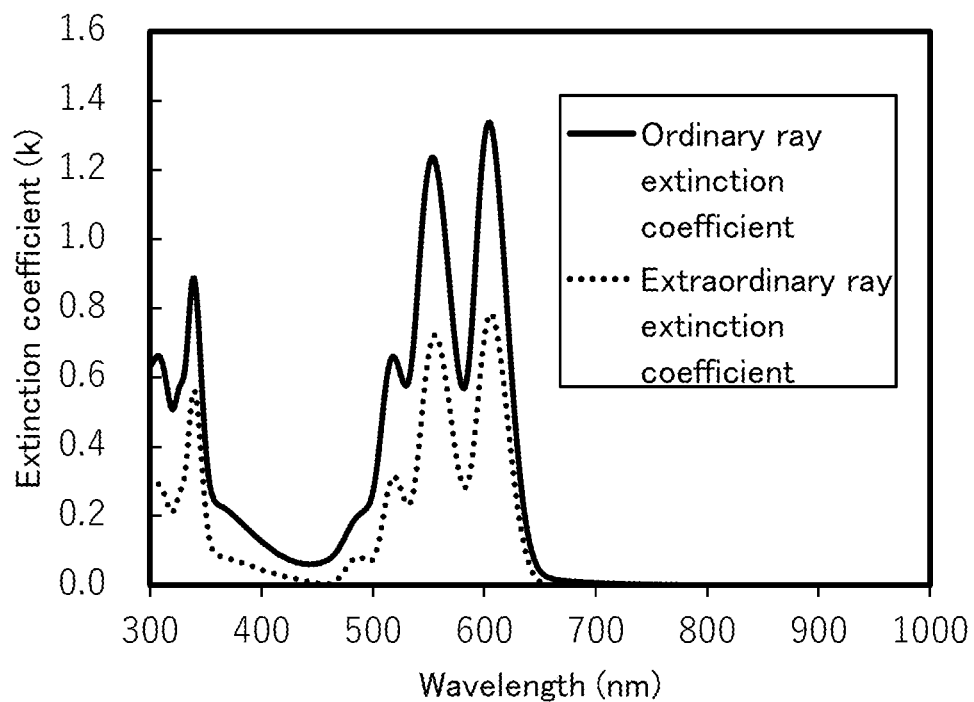
FIG. 21A is a graph showing the extinction coefficient k of DBP.
Figure 21B:
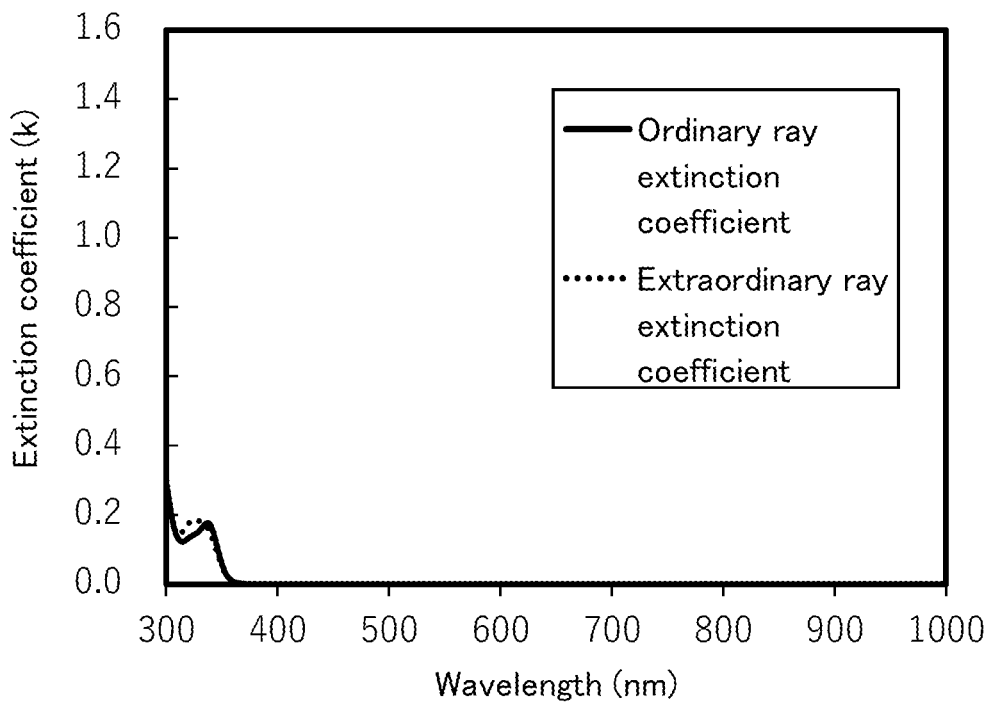
FIG. 21B is a graph showing the extinction coefficient k of DBT3P-II.

FIG. 19 shows a graph in which external quantum efficiencies when a current flows through these light-emitting devices at a current density of 5 mA/cm² are plotted with respect to the thickness of the first layer.

The maximum external quantum efficiency of the light-emitting device of one embodiment of the present invention in FIG. 19 was 15.5%, which was approximately 1.05 times as high as the maximum external quantum efficiency of the comparative light-emitting device, 14.7%. Presumably, the external quantum efficiency can be further improved by thinning the first layer to less than 100 nm in the light-emitting device of one embodiment of the present invention; accordingly, it can be said that the light-emitting device of the present invention can achieve efficiency at least 1.05 times as high as the comparative light-emitting device. Note that the external quantum efficiency is efficiency on the assumption that the light-distribution characteristics of the device are Lambertian type. When the light-distribution characteristics of the light-emitting device of one embodiment of the present invention was measured, it was 46.2% as the light-distribution Lambertian ratio. Accordingly, the maximum value of the actual external quantum efficiency of the light-emitting device of one embodiment of the present invention was 7.2%.

FIG. 20A, FIG. 20B, FIG. 21A, and FIG. 21B show measurement results of the refractive index n and the extinction coefficient k of DBP used for the first layer of the light-emitting device 1 and the light-emitting devices 1-1 to 1-4 and DBT3P-II used for the first layer of the comparative light-emitting device 1 and the comparative light-emitting devices 1-1 to 1-4. The refractive index n and the extinction coefficient k were measured with a spectroscopic ellipsometer (M-2000U, produced by J. A. Woollam Japan Corp.). A film was used for the measurement, which was formed by depositing a material to a thickness of approximately 50 nm over a quartz substrate by a vacuum evaporation method.

Note that in each of FIG. 20 and FIG. 21, A shows the result of DBP and B shows the result of DBT3P-II. In FIG. 20 and FIG. 21, a solid line represents the refractive index n or the extinction coefficient k in an ordinary ray, and a dotted line represents the refractive index n or the extinction coefficient k in an extraordinary ray.

It is found from FIG. 20 that the refractive index of DBP is higher than that of DBT3P-II in a wavelength range from 700 nm to 1000 nm, and light emitted from the EL layer can be extracted more efficiently.

Furthermore, it is found from FIG. 21 that DBP has a great extinction coefficient in the visible light wavelength range, and that absorption in the visible light region is large. In contrast, the value of the extinction coefficient of DBT3P-II is very small in the visible light region, and it is suggested that absorption in the visible light region is also very small.

Figure 22:
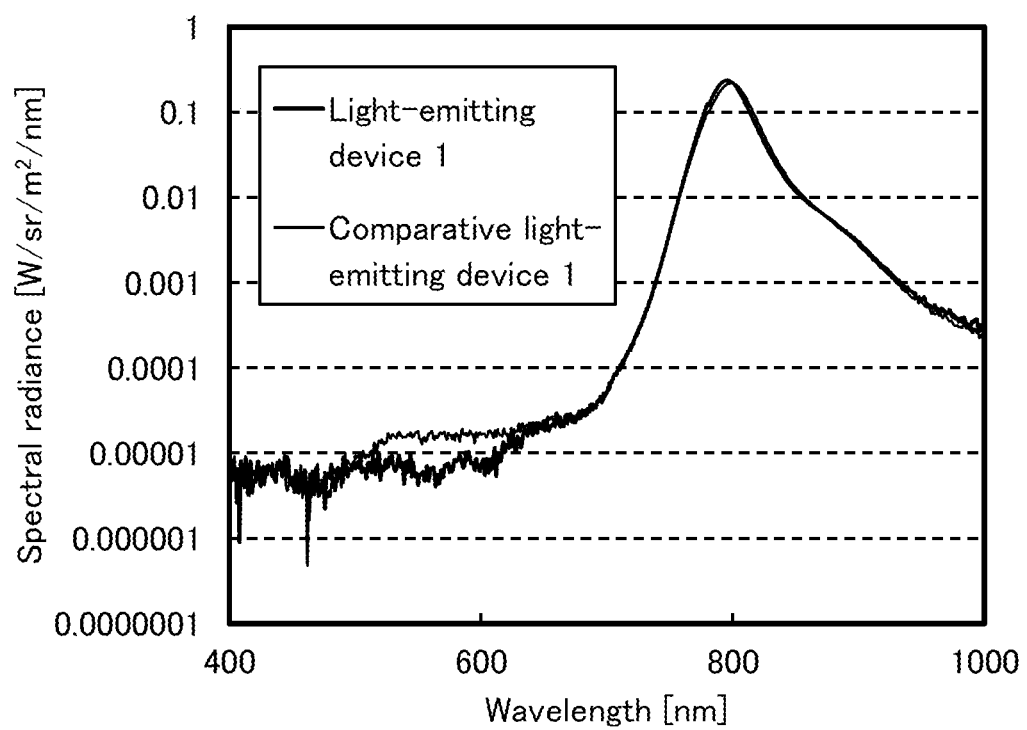
FIG. 22 is a graph showing spectral radiance-wavelength characteristics of the light-emitting device 1 and the comparative light-emitting device 1.

FIG. 22 is a graph showing spectral radiance-wavelength characteristics in the case where a voltage of 5 V is applied to the light-emitting device 1 and the comparative light-emitting device 1. In the graph, a spectroradiometer (SR-UL1R, manufactured by TOPCON TECHNOHOUSE CORPORATION) and a near-infrared spectroradiometer (SR-NIR, manufactured by TOPCON TECHNOHOUSE CORPORATION) were used for measurement in a wavelength range from 380 nm to 780 nm and measurement in a wavelength range from 781 nm to 1030 nm, respectively.

It is found that in the light-emitting device 1, DBP having a great extinction coefficient k in the visible light region was used for the first layer, and thus light emission in the visible light region is smaller than that of the comparative light-emitting device 1 using DBT3P-II not having a great extinction coefficient k in the visible light region.

The luminance (cd/m²) at the time of applying a voltage of 3.6 V was 0.598 cd/m² in the light-emitting device 1 and 1.14 cd/m² in the comparative light-emitting device 1. It is found that light emission in the visible light region is sufficiently small in the light-emitting device 1 as compared with that of the comparative light-emitting device 1 because the luminance (cd/m²) is a unit relating to luminosity factor.

Meanwhile, the radiance (W/sr/m²) under the same condition was 10.2 W/sr/m² in the light-emitting device 1 and 9.87 W/sr/m² in the comparative light-emitting device 1. The radiance (W/sr/m²) is a physical quantity representing radiant flux which is released from a point on a surface of a radiation source to a certain direction, and is not related to the luminosity factor. From the above, it was found that the energy radiated from the light-emitting device 1 is higher than that from the comparative light-emitting device 1 by using DBP for the first layer. An increase in radiance (W/sr/m$^2$) derives mainly from an increase in radiation energy in the near-infrared region, i.e., an improvement in extraction efficiency of near-infrared light because the luminance in the visible light region decreases.

The results show that the light-emitting device of one embodiment of the present invention is a near-infrared light-emitting device in which the efficiency is extremely favorable and the light is less likely to be seen.

It is also shown that the light-emitting device is a near-infrared light-emitting device having an extremely high reliability and favorable characteristics.

Reference Example 1

In this reference example, a method for synthesizing N-(4-cyclohexylphenyl)-N-(3",5"-ditertiarybutyl-1,1"-biphenyl-4-yl)-N-(9,9-dimethyl-9H-fluoren-2yl)amine (abbreviation: mmtBuBichPAF), which is the organic compound used in the example, is described. The structure of mmtBuBichPAF is shown below.

[Chemical Formula 7]

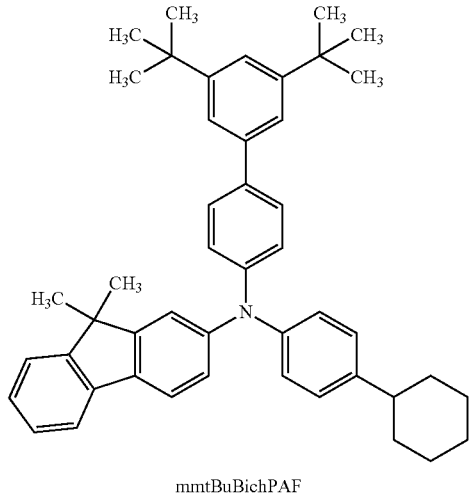

mmtBuBichPAF

<Step 1: Synthesis of 3',5'-ditertiarybutyl-4-chloro-1,1'-biphenyl>

In a three-neck flask were put 13.5 g (50 mmol) of 3,5-ditertiarybutyl-1-bromobenzene, 8.2 g (52.5 mmol) of 4-chlorophenylboronic acid, 21.8 g (158 mmol) of potassium carbonate, 125 mL of toluene, 31 mL of ethanol, and 40 mL of water. The mixture was degassed under reduced pressure, and then the air in the flask was replaced with nitrogen. To this mixture, 225 mg (1.0 mmol) of palladium acetate and 680 mg (2.0 mmol) of tris(2-methylphenyl)phosphine were added, and the mixture was heated and refluxed at 80° C. for approximately 3 hours. After that, the temperature of the flask was lowered to room temperature, and the mixture was separated into an organic layer and an aqueous layer. Magnesium sulfate was added to this solution to eliminate moisture, whereby this solution was concentrated. The obtained solution was purified by silica gel column chromatography. The obtained solution was concentrated and dried for hardening. After that, hexane was added for recrystallization. The mixed solution in which a white solid was precipitated was cooled with ice and then filtrated. The obtained solid was dried at approximately 60° C. in a vacuum, whereby 9.5 g of a target white solid was obtained in a yield of 63%. The synthesis scheme of Step 1 is shown in the formula below.

[Chemical Formula 8]

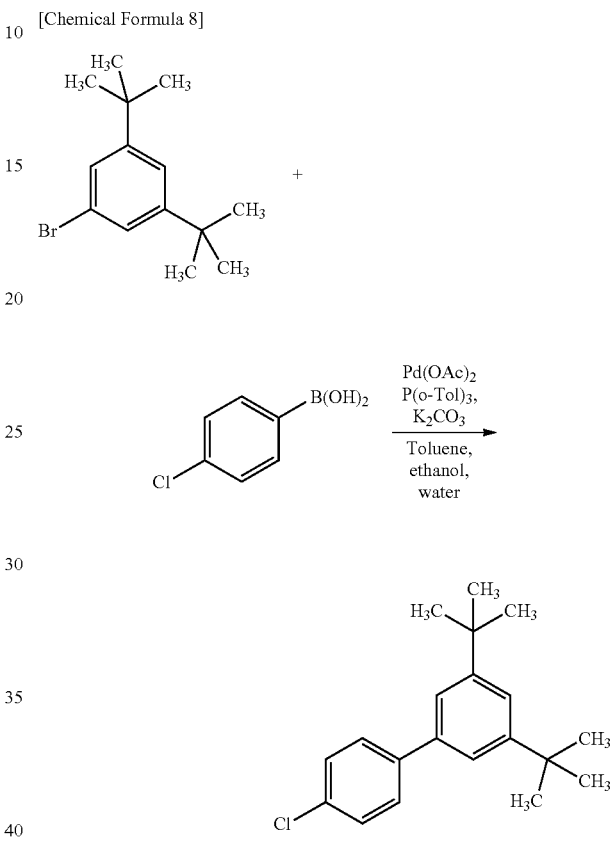

<Step 2: Synthesis of N-(4-cyclohexylphenyl)-N-(9,9-dimethyl-9H-fluoren-2yl)amine>

In a three-neck flask were put 10.5 g (50 mmol) of 9,9-dimethyl-9H-fluoren-2-amine, 12.0 g (50 mmol) of 4-cyclohexyl-1-bromobenzene, 14.4 g (150 mmol) of sodium-tert-butoxide, and 250 mL of xylene. The mixture was degassed under reduced pressure, and then the air in the flask was replaced with nitrogen. The mixture was stirred while being heated to approximately 50° C. Then, 183 mg (0.50 mmol) of allylpalladium(II) chloride dimer (abbreviation: (AllylPdCl)$_2$) and 821 mg (2.0 mmol) of di-tert-butyl (1-methyl-2,2-diphenylcyclopropyl)phosphine (abbreviation: cBRIDP (registered trademark)) were added, and the mixture was heated at 90° C. for 6 hours. After that, the temperature of the flask was lowered to approximately 60° C., approximately 4 mL of water was added, and a precipitated solid was separated by filtration. The filtrate was concentrated, and the obtained solution was purified by silica gel column chromatography. The obtained solution was concentrated to give a concentrated toluene solution. This toluene solution was dried at approximately 60° C. in a vacuum, whereby a 17.3 g of a target brown oily substance was obtained in a yield of 92%. The synthesis scheme of Step 1 is shown in the formula below.

[Chemical Formula 9]

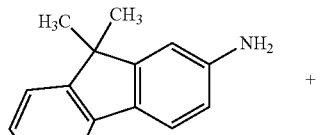

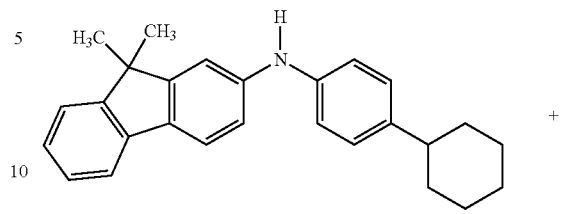

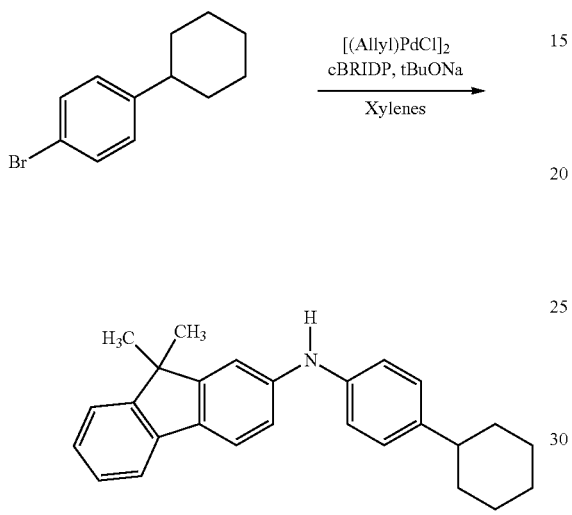

[Chemical Formula 10]

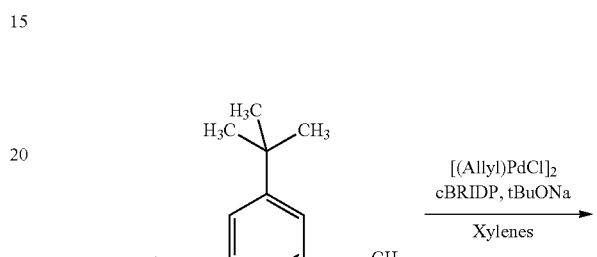

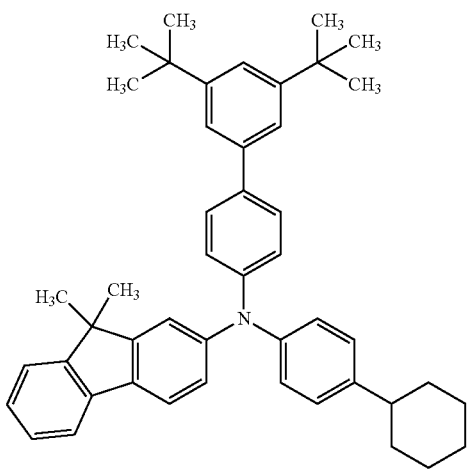

mmtBuBichPAF

<Step 3: Synthesis of N-(4-cyclohexylphenyl)-N-(3',5'-ditertiarybutyl-1,1'-biphenyl-4-yl)-N-(9,9-dimethyl-9H-fluoren-2yl)amine (Abbreviation: mmtBuBichPAF)>

In a three-neck flask were put 3.2 g (10.6 mmol) of 3',5'-ditertiarybutyl-4-chloro-1,1'-biphenyl obtained in Step 1, 3.9 g (10.6 mmol) of N-(4-cyclohexylphenyl)-N-(9,9-dimethyl-9H-fluoren-2yl)amine obtained in Step 2, 3.1 g (31.8 mmol) of sodium-tert-butoxide, and 53 mL of xylene. The mixture was degassed under reduced pressure, and then the air in the flask was replaced with nitrogen. The mixture was stirred while being heated to approximately 50° C. Then, 39 mg (0.11 mmol) of allylpalladium(II) chloride dimer (abbreviation: (AllylPdCl)$_2$) and 150 mg (0.42 mmol) of di-tert-butyl(1-methyl-2,2-diphenylcyclopropyl)phosphine (abbreviation: cBRIDP (registered trademark)) were added, and the mixture was heated at 120° C. for approximately 3 hours. After that, the temperature of the flask was lowered to approximately 60° C., and approximately 1 mL of water was added to the mixture, so that a solid was precipitated. A precipitated solid was separated by filtration. The filtrate was concentrated, and the obtained solution was purified by silica gel column chromatography. The obtained solution was concentrated to give a concentrated toluene solution. Ethanol was added to this toluene solution and the toluene solution was concentrated under reduced pressure, whereby an ethanol suspension was obtained. The precipitated solid was filtrated at approximately 20° C. and the obtained solid was dried at approximately 80° C. under reduced pressure, so that 5.8 g of a target white solid was obtained in a yield of 87%. The synthesis scheme of Step 3 is shown in the formula below.

Analysis results by nuclear magnetic resonance spectroscopy ($^1$H-NMR) of the white solid obtained in Step 3 are shown below. This indicates that mmtBuBichPAF was synthesized.

$^1$H-NMR. δ (CDCl$_3$): 7.63 (d, 1H, J=7.5 Hz), 7.57 (d, 1H, J=8.0 Hz), 7.44-7.49 (m, 2H), 7.37-7.42 (m, 4H), 7.31 (td, 1H, J=7.5 Hz, 2.0 Hz), 7.23-7.27 (m, 2H), 7.15-7.19 (m, 2H), 7.08-7.14 (m, 4H), 7.05 (dd, 1H, J=8.0 Hz, 2.0 Hz), 2.43-2.53 (brm, 1H), 1.81-1.96 (m, 4H), 1.75 (d, 1H, J=12.5 Hz), 1.32-1.48 (m, 28H), 1.20-1.31 (brm, 1H).

Reference Example 2

In this reference example, a method for synthesizing bis{4,6-dimethyl-2-[3-(3,5-dimethylphenyl)-2-benzo[g]quinoxalinyl-κN]phenyl-κC}(2,2,6,6-tetramethyl-3,5-heptanedionato-κ$^2$O,O')iridium(III) (abbreviation: [Ir(dmdpbq)$_2$(dpm)]) that is used in Example 1 is described.

[Chemical Formula 11]

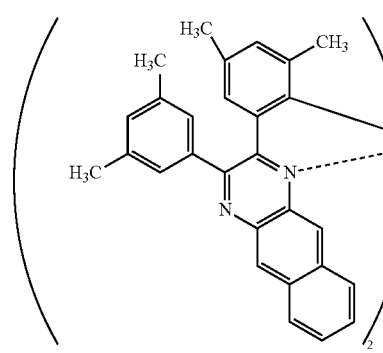

[Ir(dmdpbq)$_2$(dpm)]

[Chemical Formula 12]

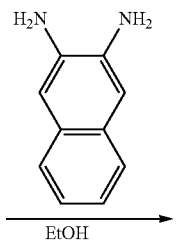

Hdmdpbq

<Step 1; Synthesis of 2,3-bis-(3,5-dimethylphenyl)-2-benzo[g]quinoxaline (Abbreviation: Hdmdpbq)>

Into a three-neck flask equipped with a reflux pipe, 3.20 g of 3,3',5,5'-tetramethylbenzyl, 1.97 g of 2,3-diaminonaphthalene, and 60 mL of ethanol were put, the air in the flask was replaced with nitrogen, and then the mixture was stirred at 90° C. for 7.5 hours. After a predetermined time elapsed, the solvent was distilled off. Then, purification by silica gel column chromatography using toluene as a developing solvent was performed, whereby the target substance was obtained (a yellow solid, yield: 3.73 g, percent yield: 79%). The synthesis scheme of Step 1 is shown below.

<Step 2; Synthesis of di-μ-chloro-tetrakis{4,6-dimethyl-2-[3-(3,5-dimethylphenyl)-2-benzo[g]quinoxalinyl-κN]phenyl-κC}diiridium(III) (Abbreviation: [Ir(dmdpbq)$_2$Cl]$_2$)>

Into a recovery flask equipped with a reflux pipe, 15 mL of 2-ethoxyethanol, 5 mL of water, 1.81 g of Hdmdpbq obtained in Step 1, and 0.66 g of iridium chloride hydrate (IrCl$_3$·H$_2$O) (produced by Furuya Metal Co., Ltd.) were put, and the air in the flask was replaced with argon. Then, microwave irradiation (2.45 GHz, 100 W) was performed for two hours to cause reaction. After a predetermined time elapsed, the obtained residue was suction-filtered and washed with methanol, whereby the target substance was obtained (a black solid, yield: 1.76 g, percent yield: 81%). The synthesis scheme of Step 2 is shown below.

[Chemical Formula 13]

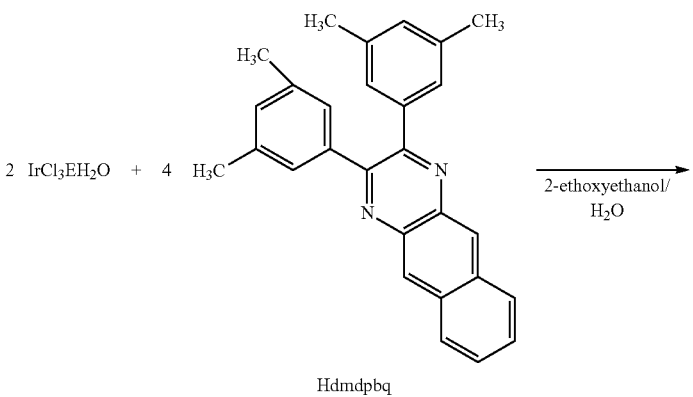

Hdmdpbq

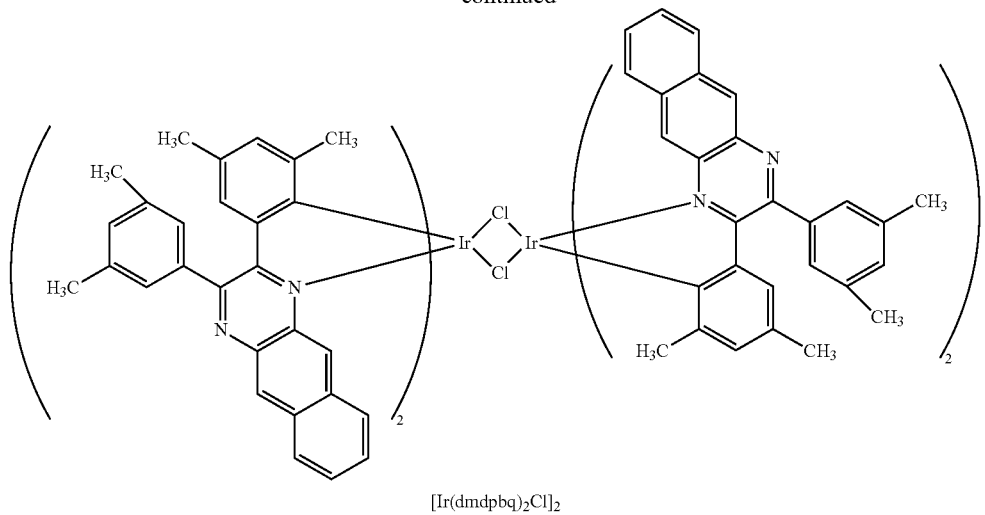

[Ir(dmdpbq)₂Cl]₂

<Step 3; Synthesis of [Ir(dmdpbq)₂(dpm)]>

Into a recovery flask equipped with a reflux pipe, 20 mL of 2-ethoxyethanol, 1.75 g of [Ir(dmdpbq)₂Cl]₂ obtained in Step 2, 0.50 g of dipivaloylmethane (abbreviation: Hdpm), and 0.95 g of sodium carbonate were put, and the air in the flask was replaced with argon. Then, microwave irradiation (2.45 GHz, 100 W) was performed for three hours. The obtained residue was suction-filtered with methanol and then washed with water and methanol. The obtained solid was purified by silica gel column chromatography using dichloromethane as a developing solvent, and then recrystallization was performed with a mixed solvent of dichloromethane and methanol, whereby the target substance was obtained (a dark green solid, yield: 0.42 g, percent yield: 21%). With a train sublimation method, 0.41 g of the obtained dark green solid was purified by sublimation. The conditions of the sublimation purification were such that the dark green solid was heated under a pressure of 2.7 Pa at 300° C. while the argon gas flowed at a flow rate of 10.5 mL/min. After the sublimation purification, a dark green solid was obtained in a percent yield of 78%. The synthesis scheme of Step 3 is shown below.

[Chemical Formula 14]

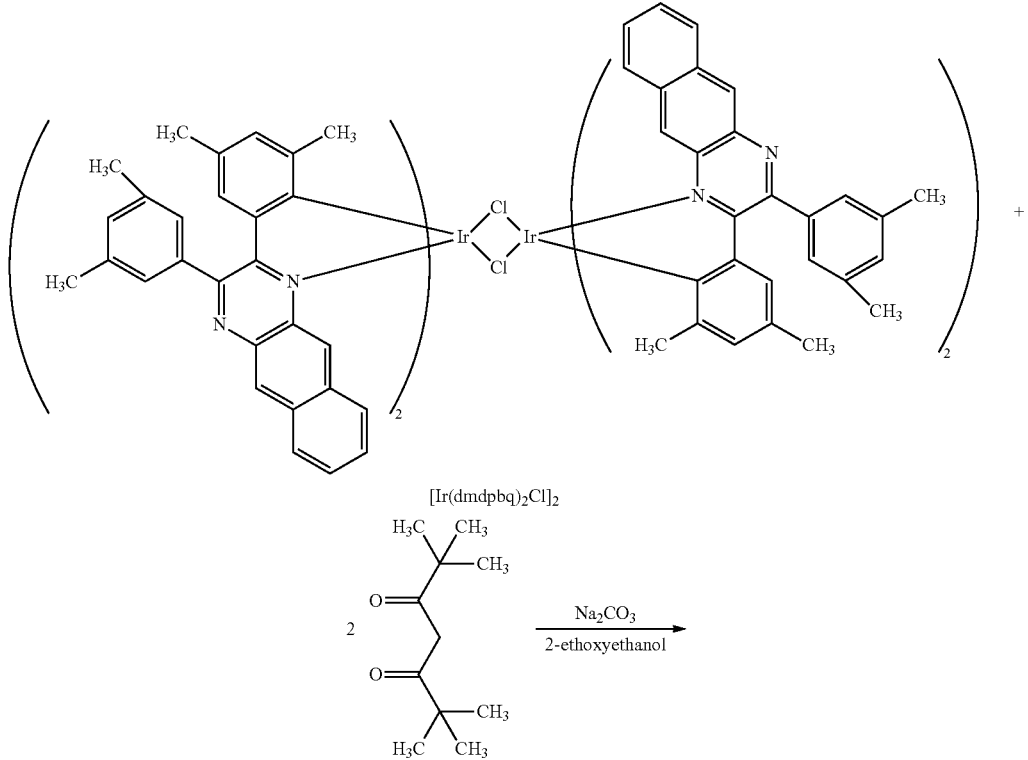

-continued

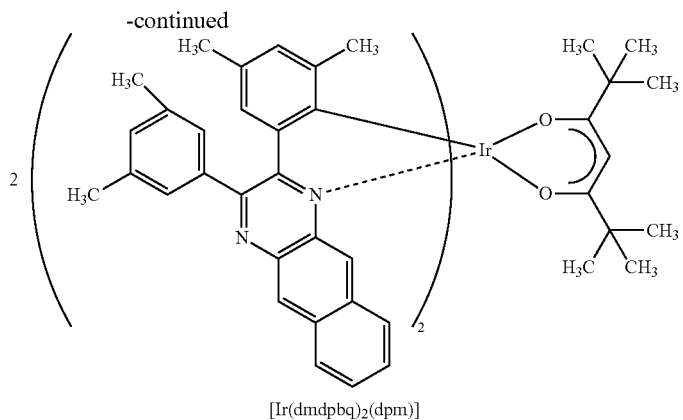

[Ir(dmdpbq)₂(dpm)]

Analysis results by nuclear magnetic resonance spectroscopy ($^1$H-NMR) of the dark green solid obtained in Step 3 are shown below. These indicate that the dark green solid obtained in Step 3 is [Ir(dmdpbq)$_2$(dpm)].

Given below is $^1$H NMR data of the obtained substance.
$^1$H-NMR. δ (CD$_2$Cl$_2$): 0.75 (s, 18H), 0.97 (s, 6H), 2.01 (s, 6H), 2.52 (s, 12H), 4.86 (s, 1H), 6.39 (s, 2H), 7.15 (s, 2H), 7.31 (s, 2H), 7.44-7.51 (m, 4H), 7.80 (d, 2H), 7.86 (s, 4H), 8.04 (d, 2H), 8.42 (s, 2H), 8.58 (s, 2H).

REFERENCE NUMERALS

1: finger, 2: input device, 3: light-emitting device, 4: imaging device, 5: image input portion, 6: input portion, 7: memory, 8: CPU, 9: database, 10: cover, 11: guide, 12: near-infrared ray transmitting filter, 100: insulating surface, 101: anode, 102: cathode, 103: EL layer, 111: hole-injection layer, 112: hole-transport layer, 113: light-emitting layer, 114: electron-transport layer, 115: electron-injection layer, 116: charge generation layer, 130: organic EL device, 140: first layer, 150: light-emitting device, 400: substrate, 401: anode, 403: EL layer, 404: cathode, 405: sealant, 406: sealant, 407: sealing substrate, 412: pad, 420: IC chip, 501: anode, 502: cathode, 511: first light-emitting unit, 512: second light-emitting unit, 513: charge generation layer, 601: driver circuit portion (source line driver circuit), 602: pixel portion, 603: driver circuit portion (gate line driver circuit), 604: sealing substrate, 605: sealant, 607: space, 608: wiring, 609: FPC (flexible printed circuit), 610: element substrate, 611: switching FET, 612: current control FET, 613: first electrode, 614: insulator, 616: EL layer, 617: second electrode, 618: light-emitting device, 951: substrate, 952: electrode, 953: insulating layer, 954: partition layer, 955: EL layer, 956: electrode, 2100: robot, 2110: arithmetic device, 2101: illuminance sensor, 2102: microphone, 2103: upper camera, 2104: speaker, 2105: display, 2106: lower camera, 2107: obstacle sensor, 2108: moving mechanism, 5000: housing, 5001: display portion, 5002: display portion, 5003: speaker, 5004: LED lamp, 5006: connection terminal, 5007: sensor, 5008: microphone, 5012: support, 5013: earphone, 5100: cleaning robot, 5101: display, 5102: camera, 5103: brush, 5104: operation button, 5150: portable information terminal, 5151: housing, 5152: display region, 5153: bend portion, 5120: dust, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7401: housing, 7402: display portion, 7403: operation button, 7404: external connection port, 7405: speaker, 7406: microphone, 9310: portable information terminal, 9311: display panel, 9313: hinge, 9315: housing This application is based on Japanese Patent Application Serial No. 2019-217749 filed on Dec. 2, 2019, the entire contents of are hereby incorporated herein by reference.

The invention claimed is:
1. A light-emitting device comprising:
a first electrode;
a second electrode;
an EL layer between the first electrode and the second electrode; and
a first layer,
wherein the EL layer emits light having a peak of an emission spectrum in a wavelength range of greater than or equal to 750 nm and less than or equal to 1000 nm,
wherein one of the first electrode and the second electrode is an electrode having a transmitting property with respect to light with a peak wavelength of the emission spectrum of the EL layer,
wherein the first layer is in contact with a surface of the electrode having a transmitting property, which is opposite to a surface where the EL layer is formed,
wherein the first layer contains an organic compound, and
wherein the first layer has the local maximum value of an extinction coefficient k in a visible light region.
2. The light-emitting device according to claim 1, wherein a refractive index n of the first layer is greater than or equal to 1.9 in the peak wavelength of the emission spectrum of the EL layer.
3. The light-emitting device according to claim 1, wherein the other of the first electrode and the second electrode is an electrode having a reflective property with respect to light with the peak wavelength of the emission spectrum of the EL layer.
4. The light-emitting device according to claim 3, wherein the electrode having a transmitting property is a transflective electrode further having a reflective property with respect to light with the peak wavelength of the emission spectrum of the EL layer.
5. The light-emitting device according to claim 1, wherein the second electrode is the electrode having a transmitting property, and
wherein the second electrode is a cathode.

6. The light-emitting device according to claim 1,
wherein the first electrode is the electrode having a transmitting property, and
wherein the first electrode is an anode.

7. The light-emitting device according to claim 1,
wherein one kind of the organic compound is contained in the first layer.

8. The light-emitting device according to claim 1,
wherein the organic compound contained in the first layer is a substance that is evaporated by resistance heating.

9. An electronic device comprising the light-emitting device according to claim 1, and at least one of a sensor, an operation button, a speaker, and a microphone.

10. A light-emitting apparatus comprising the light-emitting device according to claim 1, and at least one of a transistor and a substrate.

11. A lighting device comprising the light-emitting device according to claim 1 and a housing.

12. A light-emitting device comprising:
a first electrode;
a second electrode;
an EL layer between the first electrode and the second electrode; and
a first layer,
wherein the EL layer emits light having a peak of an emission spectrum in a wavelength range of greater than or equal to 750 nm and less than or equal to 1000 nm,
wherein one of the first electrode and the second electrode is an electrode having a transmitting property with respect to light with a peak wavelength of the emission spectrum of the EL layer,
wherein the first layer is in contact with a surface of the electrode having a transmitting property, which is opposite to a surface where the EL layer is formed,
wherein the first layer contains an organic compound, and
wherein the maximum value of an extinction coefficient k in a visible light region of the first layer is greater than or equal to 0.05.

13. The light-emitting device according to claim 12,
wherein a refractive index n of the first layer is greater than or equal to 1.9 in the peak wavelength of the emission spectrum of the EL layer.

14. The light-emitting device according to claim 12,
wherein the organic compound contained in the first layer is a substance that is evaporated by resistance heating.

15. An electronic device comprising the light-emitting device according to claim 12, and at least one of a sensor, an operation button, a speaker, and a microphone.

16. A light-emitting device comprising:
a first electrode;
a second electrode;
an EL layer between the first electrode and the second electrode; and
a first layer,
wherein the EL layer emits light having a peak of an emission spectrum in a wavelength range of greater than or equal to 750 nm and less than or equal to 1000 nm,
wherein one of the first electrode and the second electrode is an electrode having a transmitting property with respect to light with a peak wavelength of the emission spectrum of the EL layer,
wherein the first layer is in contact with a surface of the electrode having a transmitting property, which is opposite to a surface where the EL layer is formed,
wherein the first layer contains an organic compound, and
wherein the maximum value of an extinction coefficient k in a visible light region of the first layer is greater than or equal to 0.2.

17. The light-emitting device according to claim 16,
wherein a refractive index n of the first layer is greater than or equal to 1.9 in the peak wavelength of the emission spectrum of the EL layer.

18. The light-emitting device according to claim 16,
wherein the organic compound contained in the first layer is a substance that is evaporated by resistance heating.

19. An electronic device comprising the light-emitting device according to claim 16, and at least one of a sensor, an operation button, a speaker, and a microphone.

* * * * *